(12) United States Patent
Shimura

(10) Patent No.: US 12,071,037 B2
(45) Date of Patent: Aug. 27, 2024

(54) BATTERY CONTROL DEVICE, BATTERY CONTROL METHOD, UNINTERRUPTIBLE POWER SUPPLY, POWER SYSTEM, AND ELECTRIC VEHICLE

(71) Applicant: MURATA MANUFACTURING CO., LTD., Kyoto (JP)

(72) Inventor: Jusuke Shimura, Kyoto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 972 days.

(21) Appl. No.: 17/023,714

(22) Filed: Sep. 17, 2020

(65) Prior Publication Data

US 2021/0001747 A1 Jan. 7, 2021

Related U.S. Application Data

(63) Continuation of application No. PCT/JP2019/010739, filed on Mar. 15, 2019.

(30) Foreign Application Priority Data

Mar. 20, 2018 (JP) .................. 2018-052071

(51) Int. Cl.
  *H02J 7/00* (2006.01)
  *B60L 50/60* (2019.01)
  (Continued)

(52) U.S. Cl.
  CPC ............... *B60L 58/12* (2019.02); *B60L 50/60* (2019.02); *B60L 53/50* (2019.02); *B60L 58/18* (2019.02);
  (Continued)

(58) Field of Classification Search
  USPC ........................................ 320/112, 126, 132
  See application file for complete search history.

(56) References Cited

U.S. PATENT DOCUMENTS

2013/0030739 A1* 1/2013 Takahashi ............ G01R 31/392
  702/63
2013/0049457 A1  2/2013 Komatsu et al.
  (Continued)

FOREIGN PATENT DOCUMENTS

CN         103457003      12/2013
JP       2012221788 A  *  11/2012
  (Continued)

OTHER PUBLICATIONS

Extended Search Report issued Nov. 15, 2021 in corresponding European Application No. 19770513.0.
(Continued)

*Primary Examiner* — Brian Ngo
(74) *Attorney, Agent, or Firm* — K&L Gates LLP

(57) ABSTRACT

The battery control device includes: a charge/discharge controller configured to charge or discharge the secondary battery during diagnosis; an open circuit voltage curve acquisition device configured to acquire an open circuit voltage by charging or discharging the secondary battery; and an arithmetic processor configured to estimate a potential of the positive electrode and a potential of the negative electrode from an open circuit voltage curve. The battery control device controls the charge cut-off voltage and the discharge cut-off voltage such that an estimated positive potential does not exceed an upper limit and a lower limit of voltage that are preset.

18 Claims, 12 Drawing Sheets

(51) Int. Cl.
    *B60L 53/50*     (2019.01)
    *B60L 58/12*     (2019.01)
    *B60L 58/18*     (2019.01)
    *G01R 31/00*     (2006.01)
    *G01R 31/36*     (2020.01)
    *H01M 10/44*     (2006.01)
    *H01M 10/48*     (2006.01)
    *H02J 7/34*     (2006.01)

(52) U.S. Cl.
CPC ....... *G01R 31/007* (2013.01); *G01R 31/3648* (2013.01); *H01M 10/44* (2013.01); *H01M 10/48* (2013.01); *H02J 7/0013* (2013.01); *H02J 7/00712* (2020.01); *H02J 7/342* (2020.01); *H01M 2220/20* (2013.01)

(56) References Cited

U.S. PATENT DOCUMENTS

| | | |
|---|---|---|
| 2013/0314050 A1 | 11/2013 | Matsubara et al. |
| 2016/0301226 A1 | 10/2016 | Matsumura et al. |

FOREIGN PATENT DOCUMENTS

| | | | |
|---|---|---|---|
| JP | 2013051857 A | 3/2013 | |
| JP | 2013247003 A | 12/2013 | |
| JP | 2015087344 A | 5/2015 | |
| JP | 2017083274 A | 5/2017 | |
| KR | 20160051690 A | * 5/2016 | |
| WO | WO-2011155298 A1 | * 12/2011 | ......... G01R 31/3634 |

OTHER PUBLICATIONS

Hannah M. Dahn et al., "User-Friendly Differential Voltage Analysis Freeware for the Analysis of Degradation Mechanisms in LI-Ion Batteries", Journal of the Electrochemical Society, vol. 159, No. 9, pp. A1405-A1409, Aug. 14, 2012.
International Search Report for Application No. PCT/JP2019/010739, dated May 14, 2019.
Japanese Office Action issued Aug. 24, 2021 in corresponding Japanese Application No. 2020-508305.
1 Chinese Office Action issued Nov. 22, 2023 in corresponding Chinese Application No. 201980020457.
Indian Office Action issued Oct. 16, 2023 in corresponding Indian Application No. 202017038700.
European Office Action issued Dec. 21, 2023 in corresponding European Application No. 19770513.0.

\* cited by examiner

BATTERY CONTROL DEVICE, BATTERY CONTROL METHOD, UNINTERRUPTIBLE POWER SUPPLY, POWER SYSTEM, AND ELECTRIC VEHICLE

CROSS REFERENCE TO RELATED APPLICATIONS

The present application is a continuation of PCT patent application no. PCT/JP2019/010739, filed on Mar. 15, 2019, which claims priority to Japanese patent application no. JP2018-052071 filed on Mar. 20, 2018, the entire contents of which are being incorporated herein by reference.

BACKGROUND

The present technology generally relates to a battery control device, a battery control method, an uninterruptible power supply, a power system, and an electric vehicle.

In recent years, the use of secondary batteries such as lithium ion batteries is rapidly expanding to power storage devices for electric power storage combined with new energy systems such as solar cells and wind power generation, secondary batteries for automobiles, and the like. For example, an uninterruptible power supply (UPS) is used. The lithium ion batteries of the kind deteriorate with repeated charge/discharge cycles and cannot keep exhibiting their initial performance. That is, the capacity reduces and the charging time period increases. If the deterioration is left as it is, overdischarge and overcharge may occur.

In consideration of this point, when the number of charge/discharge cycles of the lithium ion battery exceeds a specified number, charge/discharge control is considered in which a charge cut-off voltage is gradually lowered and a discharge cut-off voltage is gradually increased. However, this method does not estimate or measure a degree of deterioration of a battery actually mounted on a device, and there is a possibility that the charge cut-off voltage may be lowered or the discharge cut-off voltage may be increased more than necessary.

SUMMARY

The present technology generally relates to a battery control device, a battery control method, an uninterruptible power supply, a power system, and an electric vehicle.

In the conventional technology, the devices estimate the deterioration of the lithium ion battery, and do not control the charging and discharging based on the estimated result.

Therefore, an object of the present invention is to provide a battery control device that can estimate the deterioration of a battery in a state of being mounted on an electronic device and control the charging and discharging based on the estimation result, a battery control method, a power system, and an electric vehicle.

According to an embodiment of the present disclosure, a battery control device is provided. The battery control device includes:
  a charge/discharge controller configured to charge or discharge a secondary battery during diagnosis;
  an open circuit voltage curve acquisition device configured to acquire an open circuit voltage curve by charging or discharging the secondary battery; and
  an arithmetic processor configured to estimate a potential of a positive electrode and a potential of a negative electrode from the open circuit voltage curve.

The battery control device is further configured to change a charge cut-off voltage and a discharge cut-off voltage such that an estimated potential of the positive electrode and an estimated potential of the negative electrode do not exceed an upper limit and a lower limit of potential that are preset.

According to an embodiment of the present disclosure, a battery control method is provided. The battery control method includes:
  acquiring an open circuit voltage curve by charging and/or discharging a secondary battery during diagnosis;
  estimating a potential of a positive electrode and a potential of a negative electrode from the open circuit voltage curve; and
  changing a charge cut-off voltage and a discharge cut-off voltage such that at least one of an estimated potential of the positive electrode and an estimated potential of the negative electrode do not exceed an upper limit and a lower limit of potential that are preset.

According to the above control method, the open circuit voltage curve of the secondary battery mounted on the electronic device can be obtained, and because the potential of the positive electrode and the potential of the negative electrode are estimated by calculation, the charge cut-off voltage and the discharge cut-off voltage can be changed.

According to an embodiment of the present disclosure, an uninterruptible power supply is provided. The uninterruptible power supply having a configuration in which:
  a plurality of battery modules each having a plurality of secondary batteries are provided;
  one of the plurality of battery modules is discharged to charge the others of the plurality of battery modules with a discharge current; and
  the one of the plurality of battery modules is charged by the others of the plurality of battery modules.

The uninterruptible power supply is further configured to:
  acquire an open circuit voltage curve by charging and/or discharging the battery modules;
  estimate a potential of a positive electrode and a potential of a negative electrode from the open circuit voltage curve; and
  change a charge cut-off voltage and a discharge cut-off voltage such that at least one of an estimated potential of the positive electrode and an estimated potential of the negative electrode do not exceed an upper limit and a lower limit of potential that are preset.

According to the above configuration, a fully discharged state can be generated by using the battery modules with redundant capacity, and the open circuit voltage curve can be acquired. The uninterruptible power supply used for a relatively long period can be diagnosed at any time, and reliability of the uninterruptible power supply can be improved.

According to an embodiment of the present disclosure, there is provided a power system that has a secondary battery controlled by the battery control device according to the embodiments as described herein and is charged by a power generation device whose power is configured to be generated from renewable energy by the secondary battery.

According to an embodiment of the present disclosure, there is provided a power system that has a secondary battery controlled by the battery control device according to the embodiments as described herein and is configured to supply power to an electronic device connected to the secondary battery.

According to an embodiment of the present disclosure, there is provided an electric vehicle including: a secondary battery controlled by the battery control device according to the embodiments as described herein; a converter configured to receive supply of power from the secondary battery to convert the power into driving force of the electric vehicle; and a controller configured to perform information processing related to vehicle control based on information on the secondary battery.

According to an embodiment of the present disclosure, there is provided a power system having a secondary battery controlled by the battery control device according to the embodiments as described herein, and the power system is configured to receive power from the secondary battery or supply power to the secondary battery from a power generation device or a power network.

In these power systems, reliability can be improved by diagnosing a state of the secondary battery as needed. In the electric vehicle, deterioration of the secondary battery can be prevented, and the life of the secondary battery can be extended.

According to at least an embodiment, a state at the present time of the battery can be obtained while the battery being mounted on the electronic device, and the charge cut-off voltage and the discharge cut-off voltage can be appropriately set according to that state. It should be understood that the effects described here are not necessarily limited, and may be any one of the effects described in the present disclosure or effects different therefrom.

DETAILED DESCRIPTION

As described herein, the present disclosure will be described based on examples with reference to the drawings, but the present disclosure is not to be considered limited to the examples, and various numerical values and materials in the examples are considered by way of example.

Figure 1:
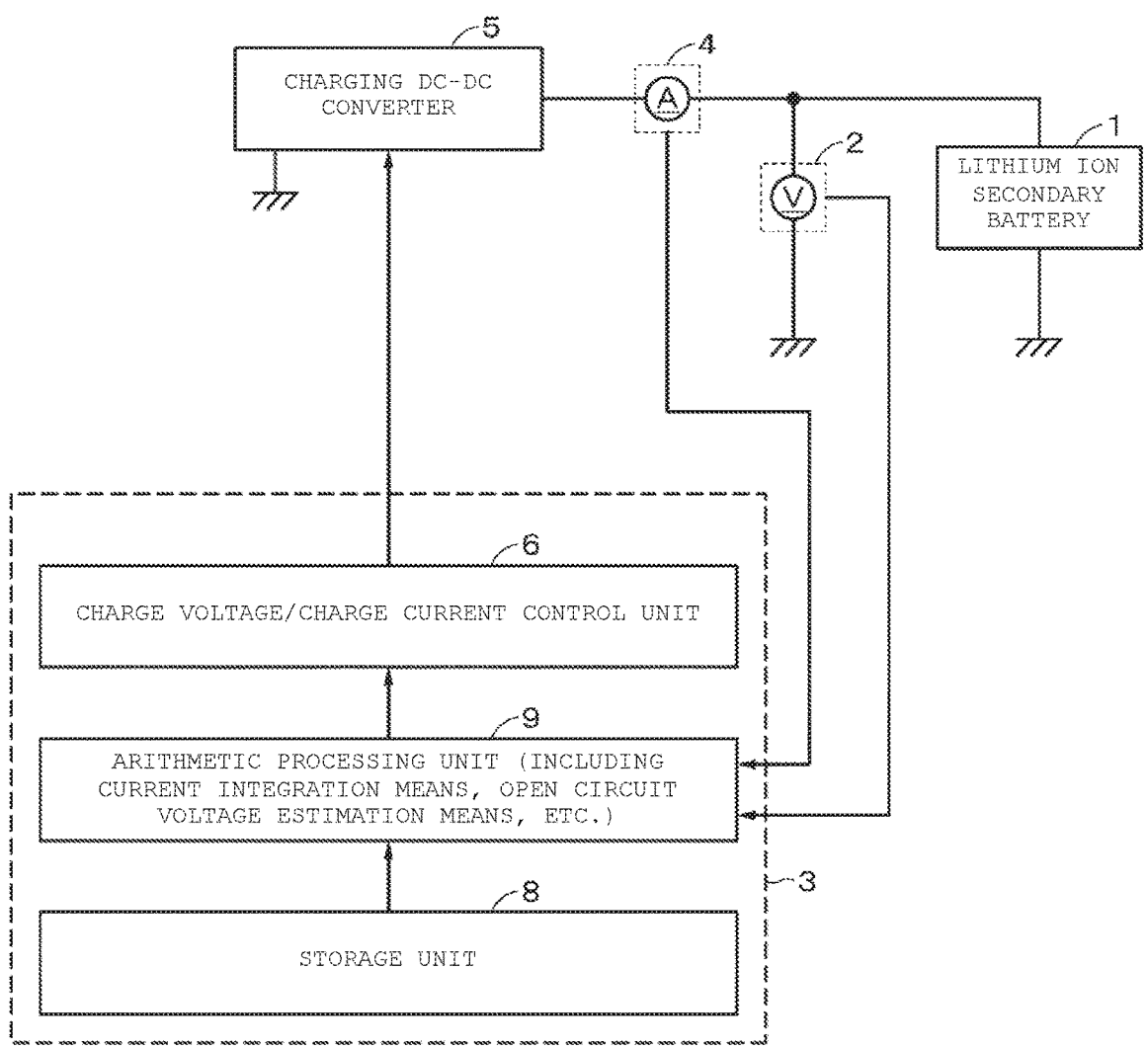
FIG. 1 is a block diagram showing a configuration according to an embodiment of the present technology.

A battery control device according to one embodiment of the present invention is described with reference to FIG. 1. In FIG. 1, reference numeral 1 is a battery to be controlled, for example, a lithium ion secondary battery. The lithium ion secondary battery 1 includes a plurality of battery blocks provided in an electronic device such as a UPS, as described later.

A voltage of the lithium ion secondary battery 1 is detected by a voltage detection unit 2, and the detected battery voltage is supplied to a control unit 3. Current of the lithium ion secondary battery 1 is detected by a current detection unit 4, and the detected signal of the current detection unit 4 is supplied to the control unit 3. Further, a charging DC-DC converter 5 is provided, and the converted voltage or current is supplied to the lithium ion secondary battery 1.

The control unit 3 includes a central processing unit (CPU), a random access memory (RAM), a read only memory (ROM), and the like. The overall operation of the battery control device is controlled according to a program stored in advance in a storage unit (ROM) 8 of the control unit 3. The detected voltage is supplied to an arithmetic processing unit 9 of the control unit 3 from the voltage detection unit 2, and the detected current is supplied thereto from the current detection unit 4.

The arithmetic processing unit (arithmetic processor) 9 receives the detected voltage and the detected current, performs the calculation as described later, and acquires a potential of a positive electrode and a potential of a negative electrode of the lithium ion secondary battery 1 in real time. Based on the calculation result of the arithmetic unit 9, a charge voltage/charge current control unit (a charge/discharge controller) 6 is controlled. The charge/discharge controller may includes a processor, a central processing unit (CPU), a random access memory (RAM), a read only memory (ROM), or the like.

Figure 2:
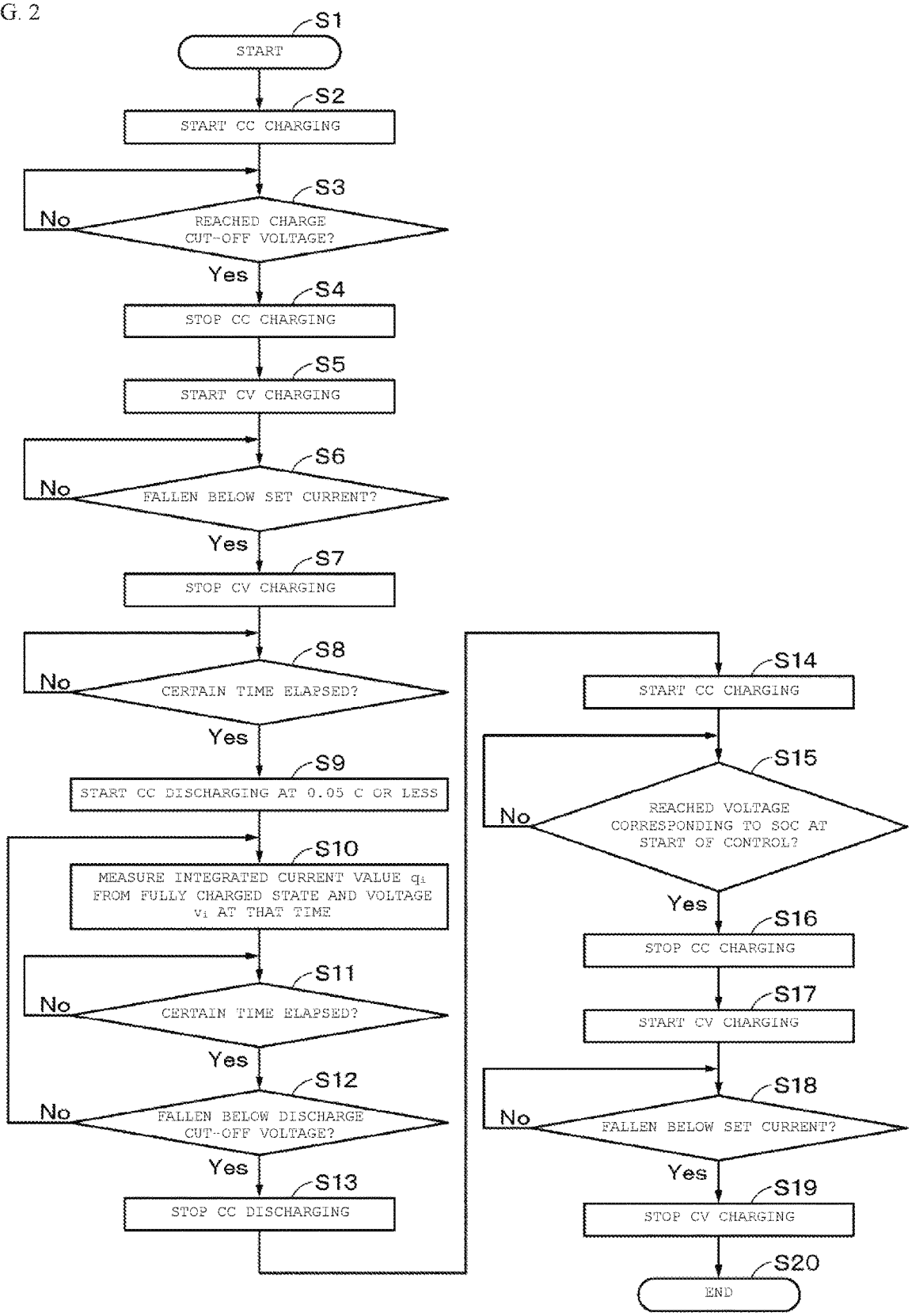
FIG. 2 is a flowchart explaining acquisition of an open circuit curve when discharging is performed at a rate of 0.05 C or less according to an embodiment of the present technology.

One example of control operation performed under the control of the control unit 3 is described with reference to a flowchart of FIG. 2.

Step S1: Processing is started.

Step S2: Constant current (CC) charging is performed in which the lithium ion secondary battery 1 is charged with a predetermined charge current of the current generation unit 5.

Step S3: It is determined whether or not the battery voltage has reached a charge cut-off voltage for CC charging. The battery voltage is detected by the voltage detection unit 2. The CC charging is performed until the battery voltage reaches the charge cut-off voltage.

Step S4: When it is determined in step S3 that the battery voltage has reached the charge cut-off voltage, the CC charging is stopped.

Step S5: Constant voltage (CV) charging is started.

Step S6: It is determined whether or not the current is a set value or less.

Step S7: When it is determined that the current is the set value or less, the CV charging is terminated.

Although the case in which the current is the specified value or less is detected as a fully charged state, the fully charged state may be detected by another method.

The processing of steps S1 to S7 described above is normal CC-CV charging processing, and the lithium ion secondary battery 1 is fully charged for the moment. Next, in step S8, it is determined whether or not a certain time period has elapsed. When it is determined that the certain time period has elapsed, the processing proceeds to step S9. Step S8 is pause processing after the battery is fully charged.

Step S9: The CC discharging is performed at 0.05 C or less.

Step S10: An integrated current value $q_i$ from the fully charged state and a voltage $v_i$ at that time are measured.

Step S11: It is determined whether or not a certain time period has elapsed.

Step S12: When it is determined that the certain time period has passed, it is determined whether or not the battery voltage has fallen below the discharge cut-off voltage.

Step S13: When it is determined in step S12 that the battery voltage has fallen below the discharge cut-off voltage, the CC discharging is stopped.

By the processing from step S9 to step S13 described above, the integrated current value $q_i$ and the voltage $v_i$ at that time are acquired while the battery is slowly discharged in full swing (from the fully charged state to the fully discharged state).

Step S14: The CC charging is started.

Step S15: It is determined whether or not the voltage has reached a voltage corresponding to a state of charge (SOC) at the start of control.

Step S16: When it is determined in step S15 that the voltage has reached the voltage corresponding to the SOC at the start of control, the CC charging is stopped. The battery is recharged to the original SOC by steps S14 to S16.

Step S17: The CV charging is started.

Step S18: It is determined whether or not the current is the set value or less.

Step S19: When the current is determined to be the set value or less, the CV charging is terminated. Although the case in which the current is the specified value or less is detected as a fully charged state, the fully charged state may be detected by another method.

Step S20: The processing is terminated.

"Another Example of Control Operation"

Figure 3:
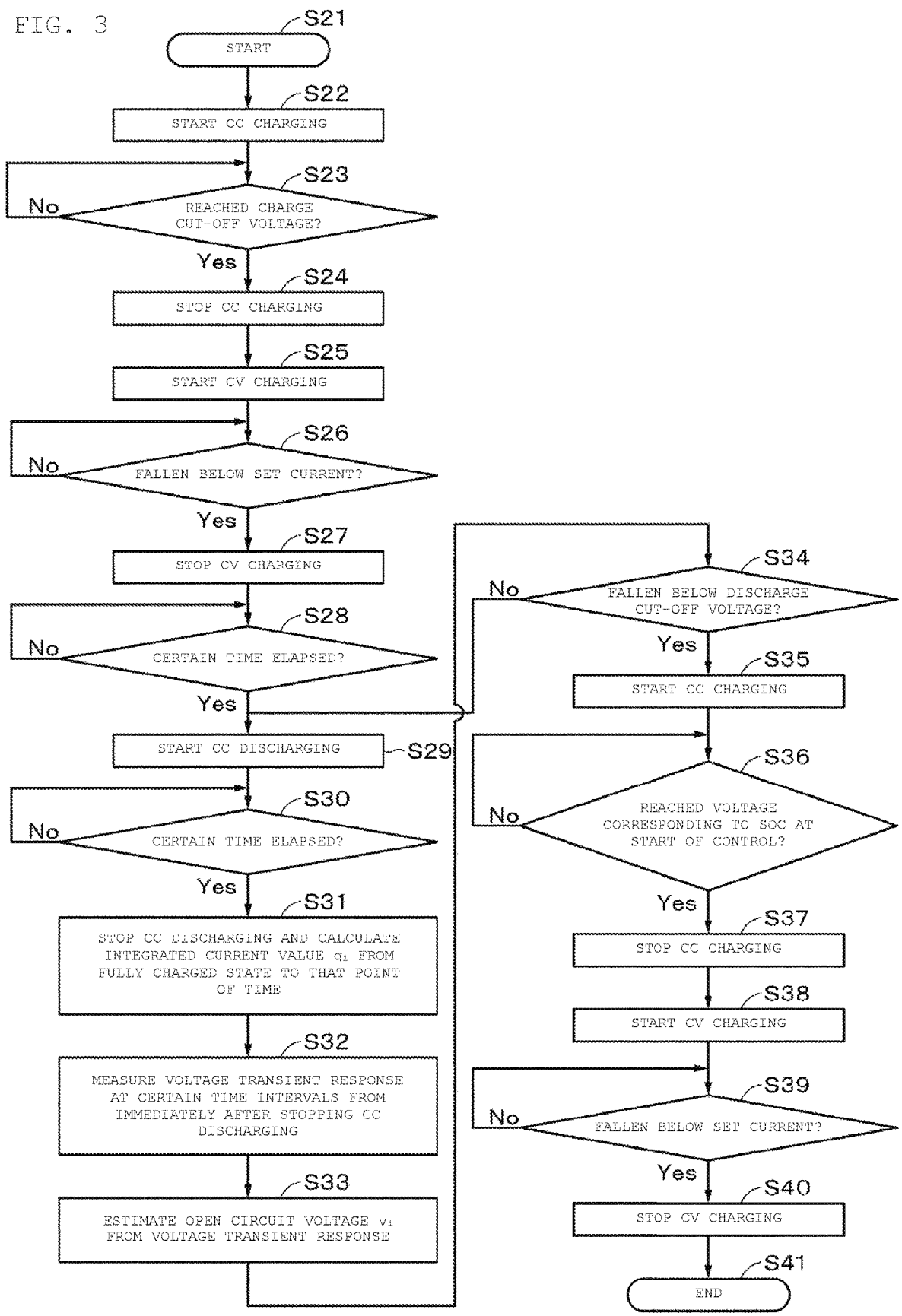
FIG. 3 is a flowchart explaining acquisition of an open circuit curve when intermittent discharging is performed at a rate of 0.5 C according to an embodiment of the present technology.

Another example of the control operation performed under the control of the control unit 3 is described with reference to a flowchart of FIG. 3.

Step S21: Processing is started.

Step S22: The CC charging is performed in which the lithium ion secondary battery 1 is charged with a predetermined charge current of the current generation unit 5.

Step S23: It is determined whether or not the battery voltage has reached the charge cut-off voltage for CC charging. The battery voltage is detected by the voltage detection unit 2. The CC charging is performed until the battery voltage reaches an upper limit voltage.

Step S24: When it is determined in step S3 that the battery voltage has reached the charge cut-off voltage, the CC charging is stopped.

Step S25: The CV charging is started.

Step S26: It is determined whether or not the current is a set value or less.

Step S27: When it is determined that the current is the set value or less, the CV charging is terminated. Although the case in which the current is the specified value or less is detected as a fully charged state, the fully charged state may be detected by another method.

The processing in steps S21 to S27 described above is normal CC-CV charging processing, and the lithium ion secondary battery 1 is fully charged for the moment. Next, in step S28, it is determined whether or not a certain time period has elapsed. When it is determined that the certain time period has elapsed, the processing proceeds to step S29. Step S28 is pause processing after the battery is fully charged. Steps S1 to S8 and steps S21 to S28 in the example of the above-described processing are the same processing.

Step S29: The CC discharging is performed.

Step S30: It is determined whether or not a certain time period has elapsed.

Step S31: When it is determined that the certain time period has elapsed, the CC discharging is stopped, and the integrated current value $q_i$ from the fully charged state to that point of time is calculated.

Step S32: Immediately after the CC discharging is stopped, a voltage transient response is measured at certain time period intervals.

Step S33: The open circuit voltage $v_i$ is estimated from the voltage transient response.

Step S34: It is determined whether or not the voltage has fallen below the discharge cut-off voltage.

Step S35: When it is determined in step S34 that the battery voltage has fallen below the discharge cut-off voltage, the CC charging is started.

Step S36: It is determined whether or not the voltage has reached a voltage corresponding to the SOC at the start of control.

Step S37: When it is determined in step S36 that the voltage has reached the voltage corresponding to the SOC at the start of control, the CC charging is stopped. The battery is recharged to the original SOC is by steps S35 to S37.

Step S38: The CV charging is started.

Step S39: It is determined whether or not the current is the set value or less.

Step S40: When it is determined that the current is the set value or less, the CV charging is terminated. Although the case in which the current is the specified value or less is detected as a fully charged state, the fully charged state may be detected by another method.

Step S41: The processing is terminated. The processing shown in FIG. 3 can be shortened in processing time as compared with the processing shown in FIG. 2 described above.

Figure 4:
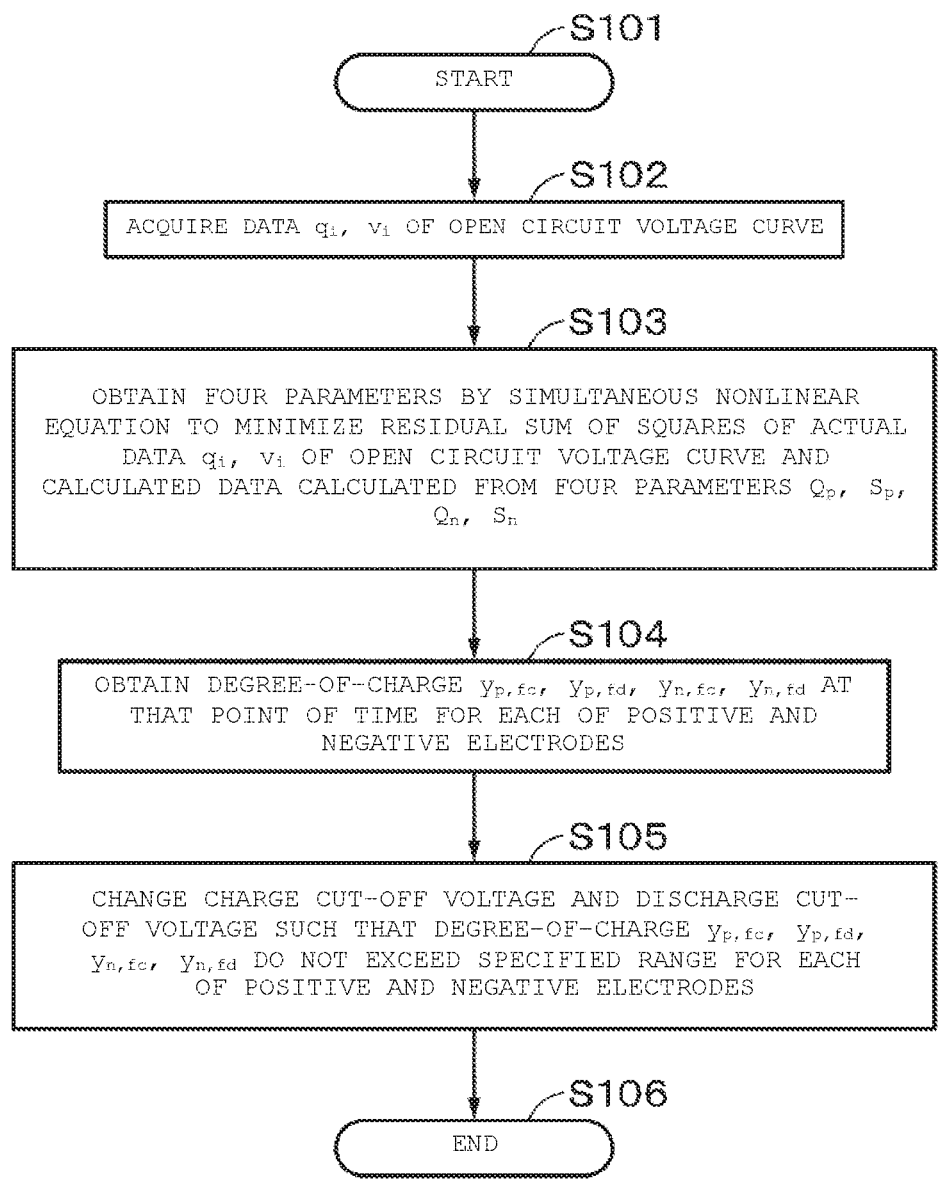
FIG. 4 is a flowchart showing the overall flow of analysis according to an embodiment of the present technology.

Next, the description is made as shown below with reference to FIG. 4 on the overall flow from when a method of estimating potentials of the positive and negative electrodes from the open circuit voltage curve is performed, to when a method of updating the charge cut-off voltage and the discharge cut-off voltage is performed.

Step S101: Processing is started.

Step S102: An open circuit voltage curve ($q_i$, $v_i$) is obtained using the above-described method (discharging at a rate of 0.05 C or less, or intermittent discharging at a rate of 0.5 C).

Step S103: Fitting is performed on the open circuit curve voltage curve ($q_i$, $v_i$) with calculated values (q, v) using four parameters ($Q_p$, $S_p$, $Q_n$, $S_n$), and the four parameters at this time is obtained.

Step 104: Degrees of charge ($y_{p,fc}$, $y_{p,fd}$, $y_{n,fc}$, $y_{n,fd}$) are calculated from the obtained four parameters.

Step 105: For the positive electrode and the negative electrode, the charge cut-off voltage ($V_{fc}$) and the discharge cut-off voltage ($V_{fd}$) are obtained such that both the positive and negative electrodes do not exceed a specified potential range, and the values are updated.

Step S106: The processing is terminated.

In the conventional charging and discharging of a secondary battery, charging and discharging between fixed voltages are repeated, for example, by permanently using the charge cut-off voltage and the discharge cut-off voltage of the first charging and discharging. However, in this case, as the number of cycles increases, the deterioration of the positive electrode and the negative electrode progresses, and as a result, the potentials of the positive electrode and the negative electrode at the charge cut-off voltage or the discharge cut-off voltage deviate slightly from the values at the first charging and discharging, which causes hidden overcharge and hidden overdischarge to occur.

Figure 5:
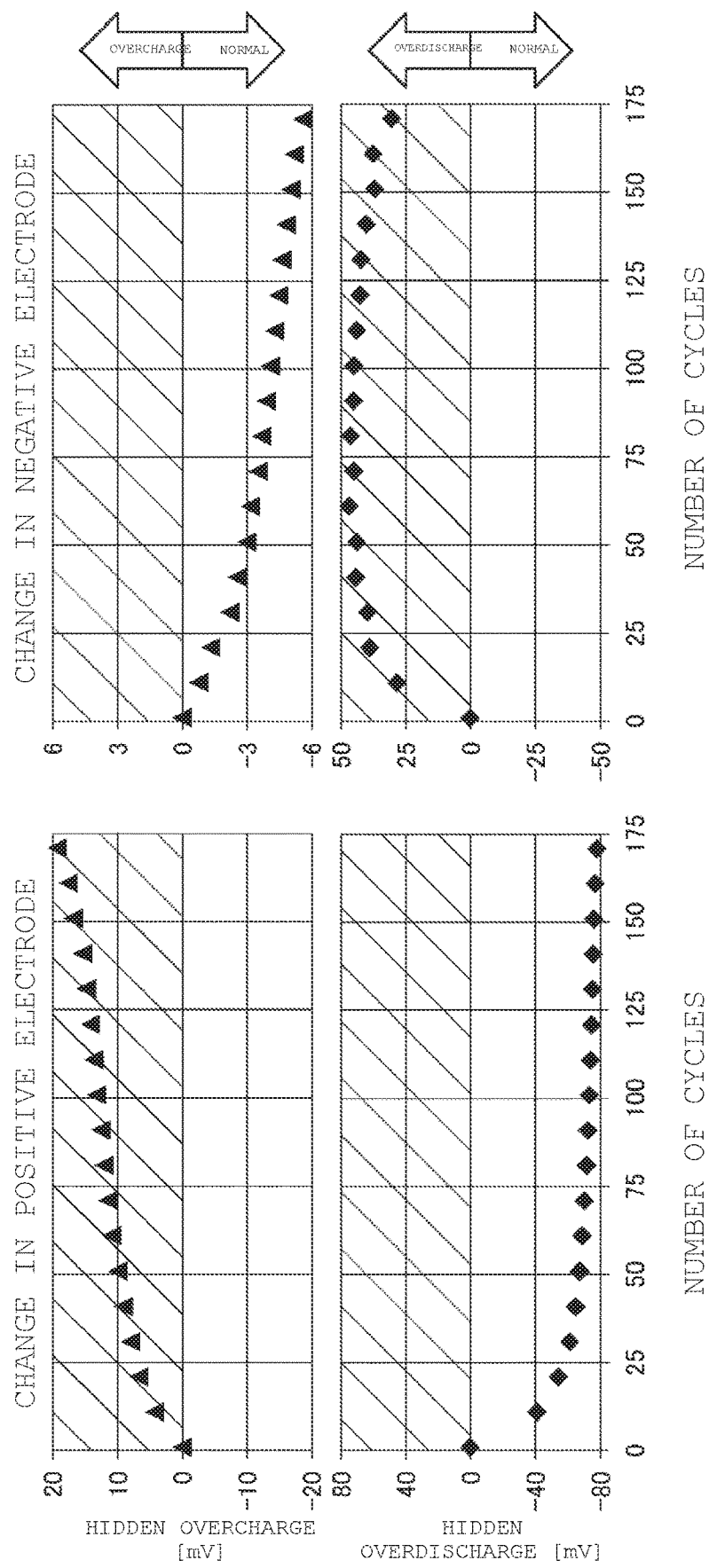
FIG. 5 is a graph illustrating hidden overcharge and hidden overdischarge according to an embodiment of the present technology.

The hidden overcharge means that at the charge cut-off voltage, the potential of the positive electrode becomes higher than that in the first charging and the potential of the negative electrode becomes lower than that in the first charging, and the hidden overdischarge means that at the discharge cut-off voltage, the potential of the positive electrode becomes lower than that in the first discharging and the potential of the negative electrode becomes higher than that in the first discharging. When the horizontal axis represents the number of charge/discharge cycles, the hidden overcharge and hidden overdischarge becomes, for example, as shown in FIG. 5.

The hidden overcharge and hidden overdischarge as such may cause deterioration of the secondary battery and a risk of smoking and ignition. In order to prevent these, it is important to understand the potentials of the positive and negative electrodes of the secondary battery.

Normally, the potentials of the positive and negative electrodes are obtained by actual measurement with three electrodes including a reference electrode. However, a secondary battery for practical use is generally constituted of two electrodes, a positive electrode and a negative electrode, and has no reference electrode. Therefore, the potentials of the positive and negative electrodes are estimated from the voltage during charging and discharging. To estimate these potentials, for example, the four parameters ($Q_p$, $S_p$, $Q_n$, $S_n$) obtained from the open circuit voltage curve are required.

As a measurement of an open circuit voltage curve, charging and discharging at a rate of 0.05 C or less has been proposed, however, this requires about 20 hours or more for one charging or discharging, which is not practical. Therefore, in the present technology, intermittent discharging is performed at a rate of 0.5 C. In this case, the individual open circuit voltage can be estimated from the voltage transient response when the discharging at 0.5 C is performed for a short time and then the circuit is opened.

Figure 6:
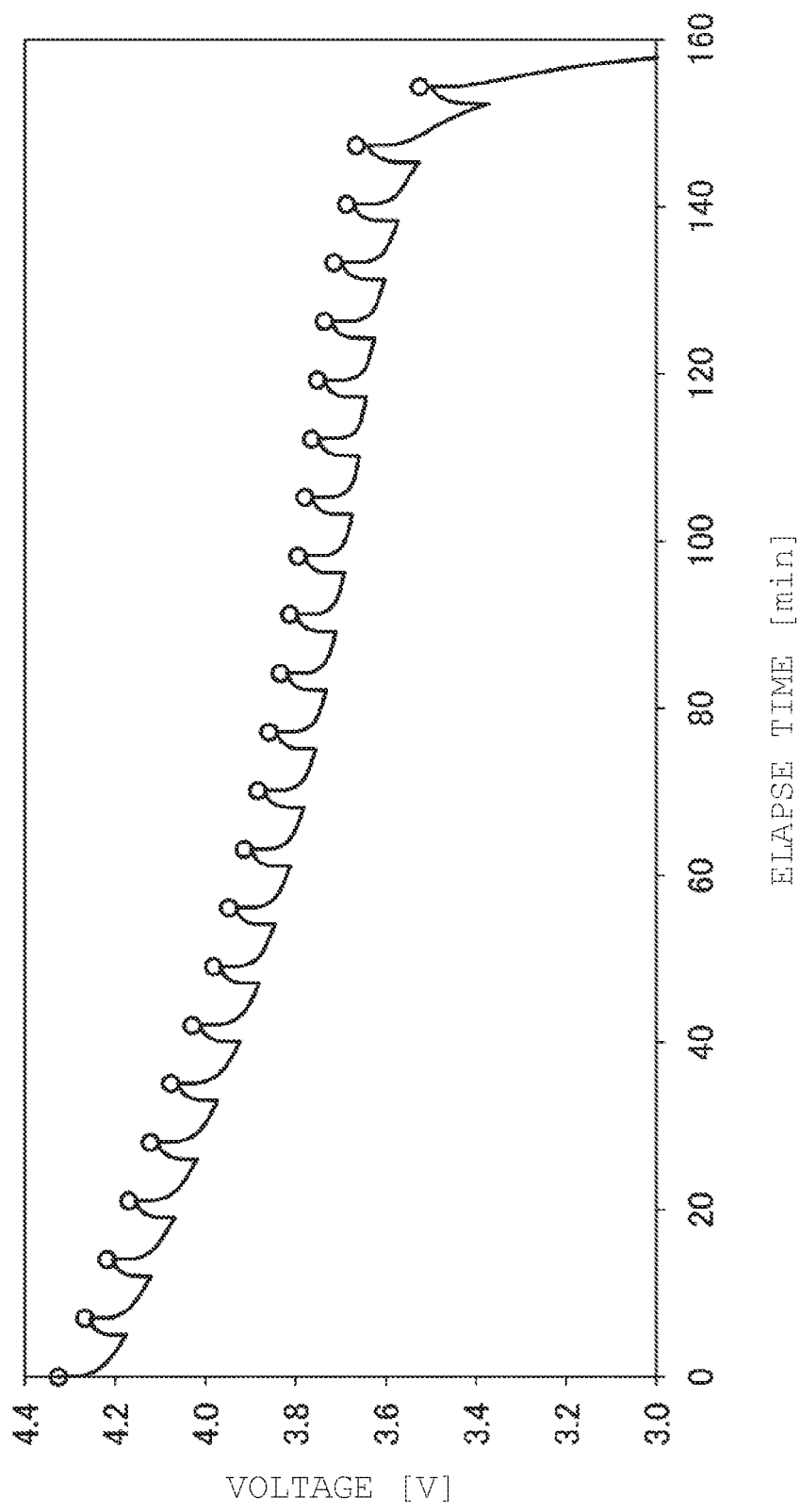
FIG. 6 is a graph illustrating intermittent discharging and estimated values of open circuit voltage according to an embodiment of the present technology.

FIG. 6 shows an example of the open circuit voltage curve measured when the intermittent discharging is performed at 0.5 C. It can be seen that the voltage suddenly falls as the discharging starts. This corresponds to a change in concentration of lithium ions near the electrodes in the battery. Therefore, in the present technology, for example, the intermittent discharging is performed by repeating discharging at 0.5 C for 5 minutes and pausing the discharging (=open state) for 2 minutes. During this discharge pause, diffusion of lithium ions progresses in the battery, and the voltage rises during the discharge pause as shown in FIG. 6. Therefore, a value estimated from a voltage curve that rises during the discharge pause is taken as the open circuit voltage. Each of circles in FIG. 6 is the estimated open circuit voltage. That is, FIG. 6 is a plot diagram of the estimated values of the open circuit voltage acquired every 7 minutes.

The estimated value of the open circuit voltage can be obtained by fitting the following formulae (formulae by Professor Nishina of Yamagata University) to the voltage curve obtained during the discharge pause of 2 minutes shown in FIG. 6.

$$V(t) = V_0 + \sum_{i=1}^{n}\left[s_i\sqrt{\frac{\pi^3}{16}\tau_i}\left\{1 - f\left(\frac{t}{\tau_i}\right)\right\}\right] \quad \text{[Mathematical formula 1]}$$

$$f(x) = \begin{cases} f_1(x), & \text{if } 0 \leq x \leq X \\ f_2(x), & \text{if } x > X \end{cases} \quad \text{[Mathematical formula 2]}$$

$$f_1(x) = 1 - \sqrt{\frac{16}{\pi^3}x} \quad \text{[Mathematical formula 3]}$$

$$f_2(x) = \frac{8}{\pi^2}e^{-x} \quad \text{[Mathematical formula 4]}$$

$$X = \operatorname{argmin}|f_1(x) - f_2(x)| \quad \text{[Mathematical formula 5]}$$

These formulae describe the voltage transient response in the pause after the intermittent discharging at 0.5 C, and $V_0$ is the voltage when the discharge pause is started. By fitting these formulae to the voltage value during the discharge pause, $s_i$ and $\tau_i$ are recursively obtained, and V(t) when $t \to \infty$ is taken as the open circuit voltage. This fitting is performed every time the discharging is paused for 2 minutes in FIG. 6, and the open circuit voltage is obtained.

As a method of obtaining a discharge capacity ($q_i$) and a cell voltage ($v_i$) of the open circuit voltage curve, the description has been made on the method of performing the discharging at the rate of 0.05 C or less and the method of performing the intermittent discharging at the rate of 0.5 C. However, the discharge capacity ($q_i$) and the cell voltage ($v_i$) of the open circuit voltage curve can be obtained even in the case of performing the charging at the rate of 0.05 C or less, or performing the intermittently charging at the rate of 0.5 C.

The discharge capacity ($q_i$) and the cell voltage ($v_i$) of the open circuit voltage curve obtained by the above method are fitted to a relational formula between the calculated value of discharge capacity (q) and the calculated value of cell voltage (v) using parameters, and by using the parameters used at that time, a potential of the positive electrode ($\varphi_p$) and a potential of the negative electrode ($\varphi_n$) are obtained. A discharge curve at a discharge current (j) is expressed as follows using five parameters.

[Mathematical formula 6]

$$v = \varphi_p\left(\frac{q - S_p}{Q_p}\right) - \varphi_n\left(\frac{q - S_n}{Q_n}\right) + R_0 j \quad (1)$$

Here, as the five parameters, $Q_p$ is a positive net capacity (positive electrode expansion rate), $Q_n$ is a negative net capacity (negative electrode expansion rate), $S_p$ is a positive slippage (positive electrode parallel displacement), and $S_n$ is a negative slippage (negative electrode parallel displacement), $R_O$ is an ohmic resistance. At this time, $(q-S_p)/Q_p$ and $(q-S_n)/Q_n$ take values from 0 to 1. This formula (1) is fitted so as to minimize a residual sum of squares for the discharge capacity ($q_i$) and the cell voltage ($v_i$) of the intermittent discharging at 0.5 C as shown in FIG. 6 or the discharge capacity ($q_i$) and the cell voltage ($v_i$) of the discharge curve at 0.05 C, and to thereby find the combination of the five parameters.

These five parameters are obtained by, for example, establishing a simultaneous nonlinear equation with N unknowns under an excessive condition and performing a numerical analysis using the Newton-Raphson method, and thereby the potential of the positive electrode ($\varphi_p$) and the potential of the negative electrode ($\varphi_n$) are obtained. At this time, the discharge capacity (Q) can also be obtained from the five parameters.

In order to prevent the above-described hidden overcharge and hidden overdischarge, the voltage for stopping the charging and discharging may be updated. As the number of cycles increases, the voltage to stop charging (charge cut-off voltage) is updated to be lower than that at the first charging and discharging, and the voltage to stop discharging (discharge cut-off voltage) is updated to be higher than that at the first charging and discharging. The method is described below.

In the following, the potential of the positive electrode ($\varphi_p$) and the potential of the negative electrode ($\varphi_n$) are expressed as a function of a degree of discharge (x), and a positive electrode potential function is denoted as $\varphi_p(x)$ and a negative electrode potential function is denoted as $\varphi_n(x)$. x is the degree of charge, which takes a range of 0 to 1, and the closer x is to 0, the more charged the battery is, and the closer x is to 1, the more discharged the battery is. Generally, the positive electrode is used in a range of approximately 3.5 to 4.5 V, and the negative electrode is used in a range of approximately 0.0 to 1.5 V, therefore, in here, for example, in the range of x, the above ranges are specified as both ends of charging and discharging as follows.

[Mathematical formula 7]

$$\begin{cases} \varphi_p(x)|_{x=0} = 4.5 \text{ V vs. Li}|\text{Li}^+ \\ \varphi_p(x)|_{x=1} = 3.5 \text{ V vs. Li}|\text{Li}^+ \end{cases} \quad (2)$$

[Mathematical formula 8]

$$\begin{cases} \varphi_n(x)|_{x=0} = 0.0 \text{ V vs. Li}|\text{Li}^+ \\ \varphi_n(x)|_{x=1} = 1.5 \text{ V vs. Li}|\text{Li}^+ \end{cases} \quad (3)$$

Figure 7:
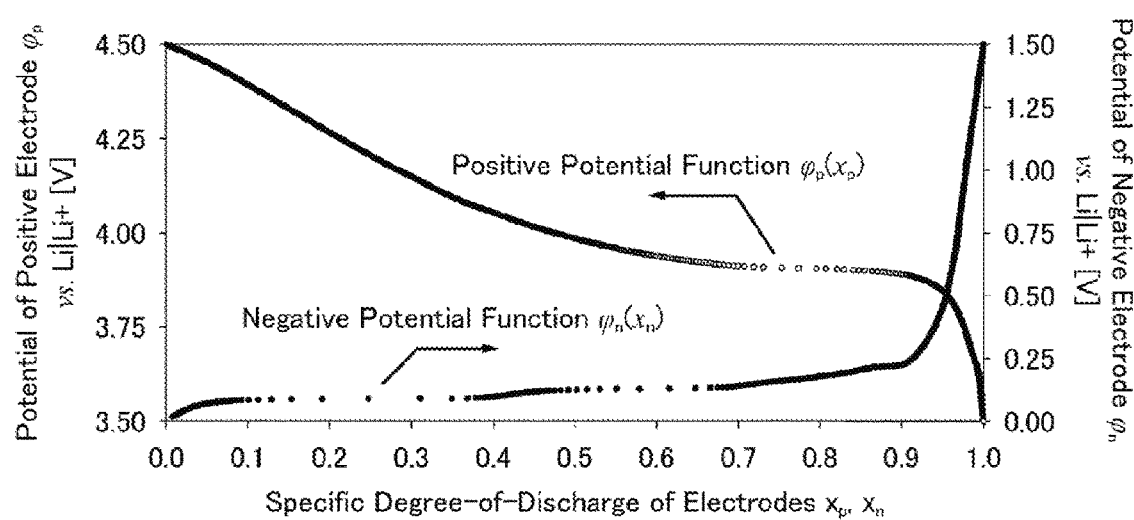
FIG. 7 is a graph showing a relationship between a potential of a positive electrode, a potential of a negative electrode, and a degree of discharge in a lithium ion secondary battery according to an embodiment of the present technology.

FIG. 7 shows an example of the relationship, including formulae (2) and (3), between the potential of the positive electrode, the potential of the negative electrode, and the degree of discharge. It is not always the case that x=0 is in the fully charged state and x=1 is in the fully discharged state, and when the degree of discharge of the positive electrode in the fully charged state is denoted as $x_{p,fc}$, the degree of discharge of the positive electrode in the fully discharged state as $x_{p,fd}$, the degree of discharge of the negative electrode in the fully charged state as $x_{n,fc}$, and the degree of discharge of the negative electrode in the fully discharged state as $x_{n,fd}$, the relationship can be shown as in formula (4).

[Mathematical formula 9]

$$\begin{cases} 0 \le x_{p,fc}^{(n)} < x_{p,fd}^{(n)} \le 1 \\ 0 \le x_{n,fc}^{(n)} < x_{n,fd}^{(n)} \le 1 \end{cases} \quad (4)$$

Here, a superscript (n) on an upper right of x represents the number of charge/discharge cycles. For the first charging and discharging, n=1. A degree of charge (y) is defined as in formula (5).

[Mathematical formula 10]

$$y = 1 - x \quad (5)$$

The degree of charge of the positive electrode in the fully charged state is denoted as $y_{p,fc}$, the degree of charge of the positive electrode in the fully discharged state as $y_{p,fd}$, the degree of charge of the negative electrode in the fully charged state as $y_{n,fc}$, and the degree of charge of the negative electrode in the fully discharged state as $y_{n,fd}$. These values are expressed as in formula (6) using the positive net capacity, the negative net capacity, the positive slippage, the negative slippage, and the discharge capacity, which are obtained by the above-described method of estimating the potentials of the positive and negative electrodes.

[Mathematical formula 11]

$$\begin{cases} y_{p,fc}^{(n)} = 1 + \dfrac{S_p^{(n)}}{Q_p^{(n)}} \\ y_{p,fd}^{(n)} = 1 - \dfrac{Q^{(n)} - S_p^{(n)}}{Q_p^{(n)}} \\ y_{n,fc}^{(n)} = 1 + \dfrac{S_n^{(n)}}{Q_n^{(n)}} \\ y_{n,fd}^{(n)} = 1 - \dfrac{Q^{(n)} - S_n^{(n)}}{Q_n^{(n)}} \end{cases} \quad (6)$$

Here, the superscripts (n) on the upper right of such as y and Q represent the number of charge/discharge cycles. By using the degree of charge when n=1, the hidden overcharge of the positive electrode can be expressed by formula (7), the hidden overdischarge of the positive electrode can be expressed by formula (8), the hidden overcharge of the negative electrode can be expressed by formula (9), and the hidden overdischarge of the negative electrode can be expressed by formula (10).

[Mathematical formula 12]

$$y_{p,fc}^{(n)} > y_{p,fc}^{(1)} \quad (7)$$

[Mathematical formula 13]

$$y_{p,fd}^{(n)} < y_{p,fd}^{(1)} \quad (8)$$

[Mathematical formula 14]

$$y_{n,fc}^{(n)} < y_{n,fc}^{(1)} \quad (9)$$

[Mathematical formula 15]

$$y_{n,fd}^{(n)} > y_{n,fd}^{(1)} \quad (10)$$

Figure 8:
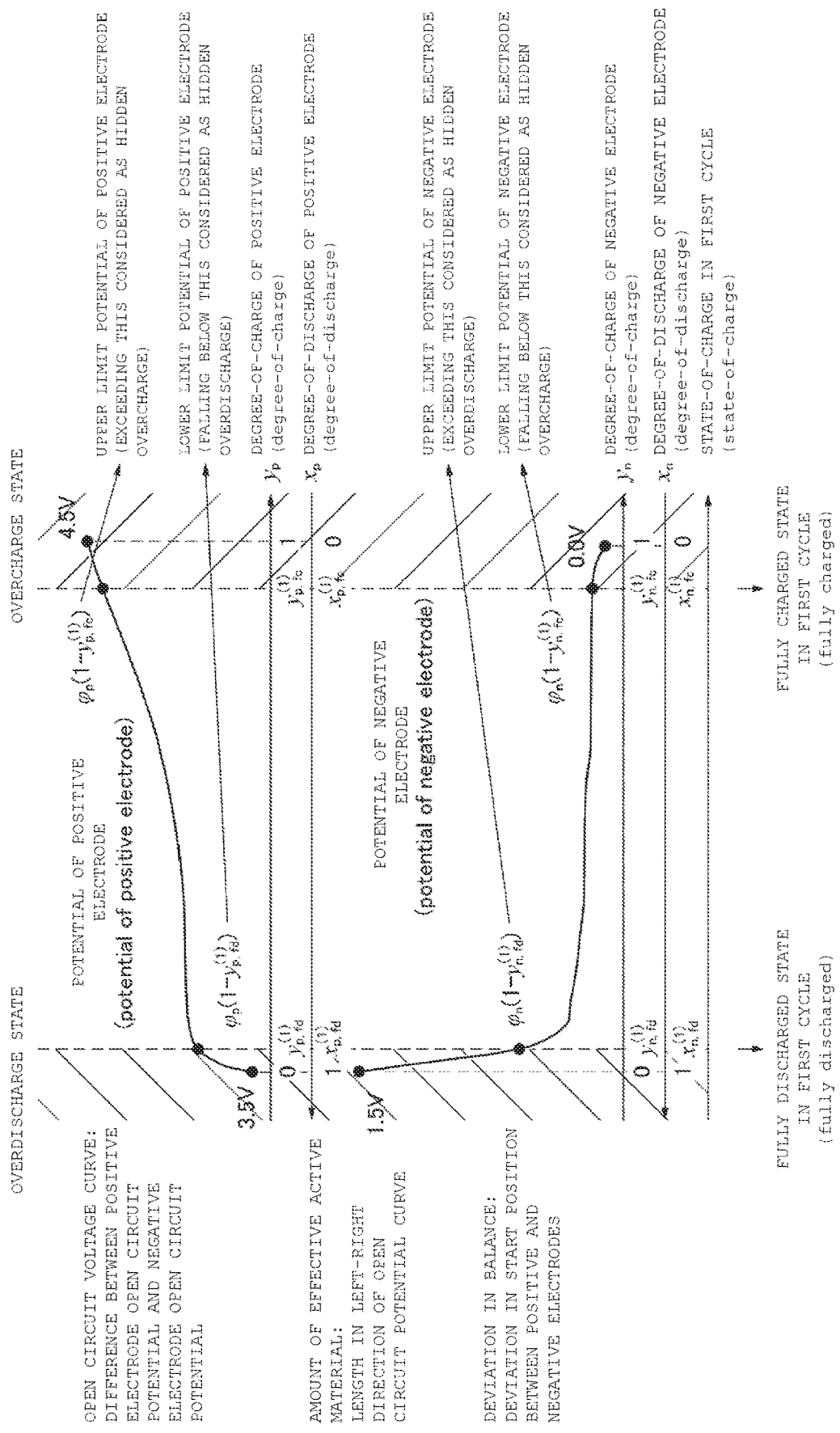
FIG. 8 is a diagram showing a relationship between hidden overcharge, hidden overdischarge and each parameter according to an embodiment of the present technology.

FIG. 8 shows the relationship between these parameters and the hidden overcharge and the hidden overdischarge. $\varphi_p(1-y_{p,fc}^{(1)})$ is the upper limit potential of the positive electrode, and a potential exceeding this potential can be considered as the hidden overcharge, and $\varphi_p(1-y_{p,fd}^{(1)})$ is the lower limit potential of the positive electrode, and a potential falling below this potential can be considered as the hidden overdischarge. $\varphi_n(1-y_{n,fc}^{(1)})$ is the lower limit potential of the negative electrode, and a potential falling below this potential can be considered as the hidden overcharge, and $\varphi_n(1-y_{n,fd}^{(1)})$ is the upper limit potential of the negative electrode, and a potential exceeding this potential can be considered as the hidden overdischarge. In order to prevent the hidden overcharge and the hidden overdischarge as such, the formulae (7) to (10) are made not to be satisfied in the charging and discharging in the nth cycle. In order to achieve this, it is necessary to lower the charge cut-off voltage and to increase the discharge cut-off voltage. Therefore, the charge cut-off voltage is set to $V_{fc}$, the discharge cut-off voltage is set to $V_{fd}$, and the settings are made as shown in formula (11).

[Mathematical formula 16]

$$\begin{cases} V_{fc}^{(n)} = \varphi_p(1 - (y_{p,fc}^{(n)} - y_{p,fd}^{(n)})s_{fc}^{(n)} - y_{p,fd}^{(n)}) - \varphi_n(1 - (y_{n,fc}^{(n)} - y_{n,fd}^{(n)})s_{fc}^{(n)} - y_{n,fd}^{(n)}) \\ V_{fd}^{(n)} = \varphi_p(1 - (y_{p,fc}^{(n)} - y_{p,fd}^{(n)})s_{fd}^{(n)} - y_{p,fd}^{(n)}) - \varphi_n(1 - (y_{n,fc}^{(n)} - y_{n,fd}^{(n)})s_{fd}^{(n)} - y_{n,fd}^{(n)}) \end{cases} \quad (11)$$

Here, the superscript (n) on the upper right of V represents the number of charge/discharge cycles. $s_{fc}$ and $s_{fd}$ in formula (11) are defined as in formula (12).

[Mathematical formula 17]

$$\begin{cases} s_{fc}^{(n)} \equiv \min\left\{ \frac{y_{p,fc}^{(1)} - y_{p,fd}^{(n)}}{y_{p,fc}^{(n)} - y_{p,fd}^{(n)}}, \frac{y_{n,fc}^{(1)} - y_{n,fd}^{(n)}}{y_{n,fc}^{(n)} - y_{n,fd}^{(n)}} \right\} \\ s_{fd}^{(n)} \equiv \min\left\{ \frac{y_{p,fd}^{(1)} - y_{p,fd}^{(n)}}{y_{p,fc}^{(n)} - y_{p,fd}^{(n)}}, \frac{y_{n,fd}^{(1)} - y_{n,fd}^{(n)}}{y_{n,fc}^{(n)} - y_{n,fd}^{(n)}} \right\} \end{cases} \quad (12)$$

Examples and Comparative Examples

Under the following conditions, the discharge capacity and the charging time period were measured while charging and discharging were repeated.
Condition 1 (Comparative example): A charge/discharge cycle test was performed while the charge cut-off voltage and the discharge cut-off voltage were fixed.
Condition 2 (Example): The charge/discharge cycle test was performed while the charge cut-off voltage and the discharge cut-off voltage set by formula (12) were sequentially updated so as to prevent the hidden overcharge and hidden overdischarge from occurring.

Figure 9:
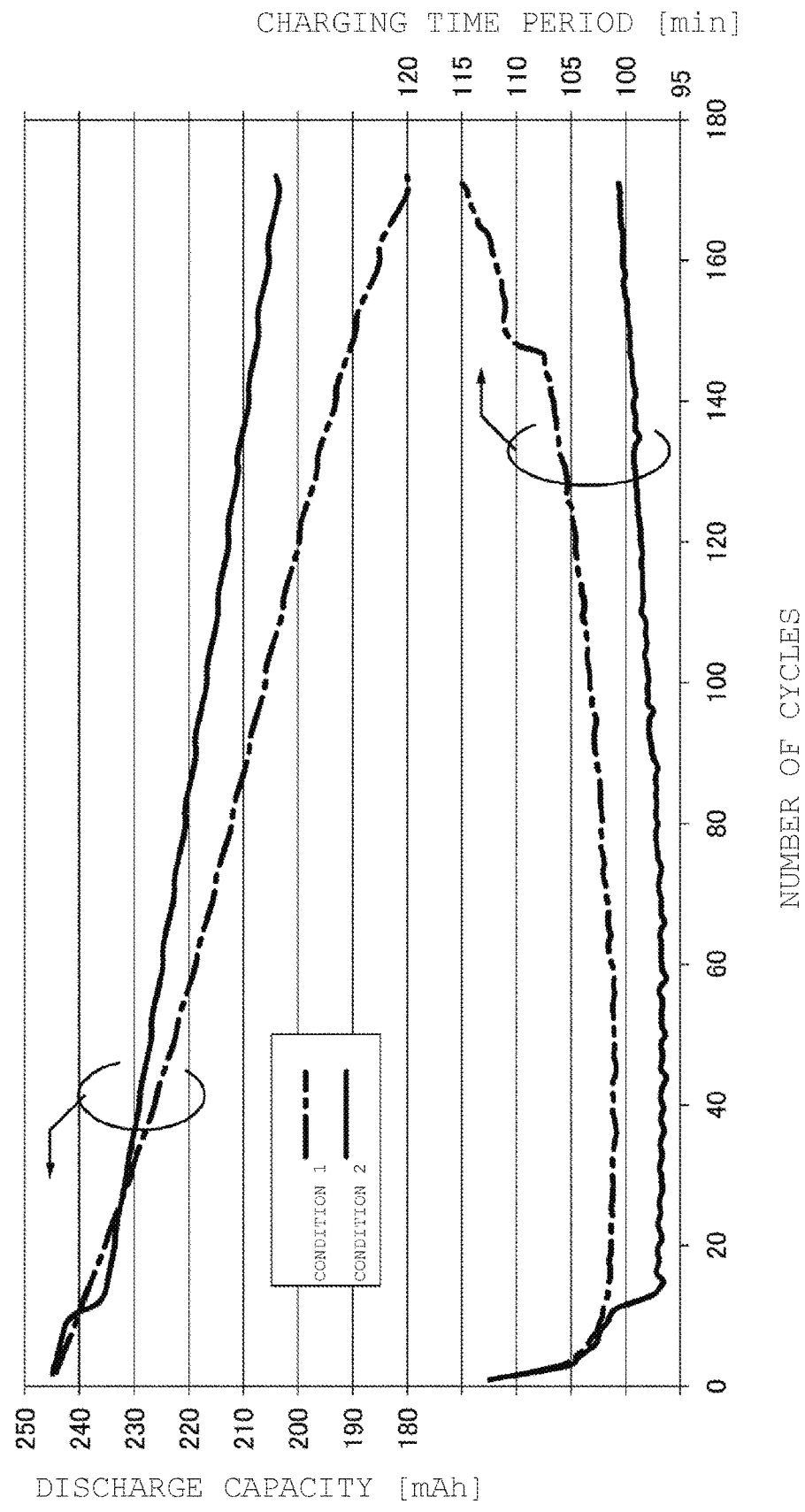
FIG. 9 is a graph illustrating an effect according to an embodiment of the present technology.

The results are shown in FIG. 9. It can be seen from FIG. 9 that, for example, when the number of cycles is 170, the discharge capacity of the example is about 10% higher than that of the comparative example, and the charging time period of the example is about 10% shorter than that of the comparative example. It has been found that in the example, the deterioration of the discharge capacity can be prevented and the extension of the charging time period can be suppressed further than in the comparative example.

Now, a suitable example of one embodiment is introduced. A suitable example is a UPS that includes a plurality of battery modules with sufficient capacity. In this example, one of the plurality of battery modules is charged and discharged, the open circuit voltage curve is acquired, and the charge cut-off voltage and the discharge cut-off voltage are estimated. It is characterized in that electric power that flows in and out of the one battery module at that time is exchanged from other battery modules.

Figure 10:
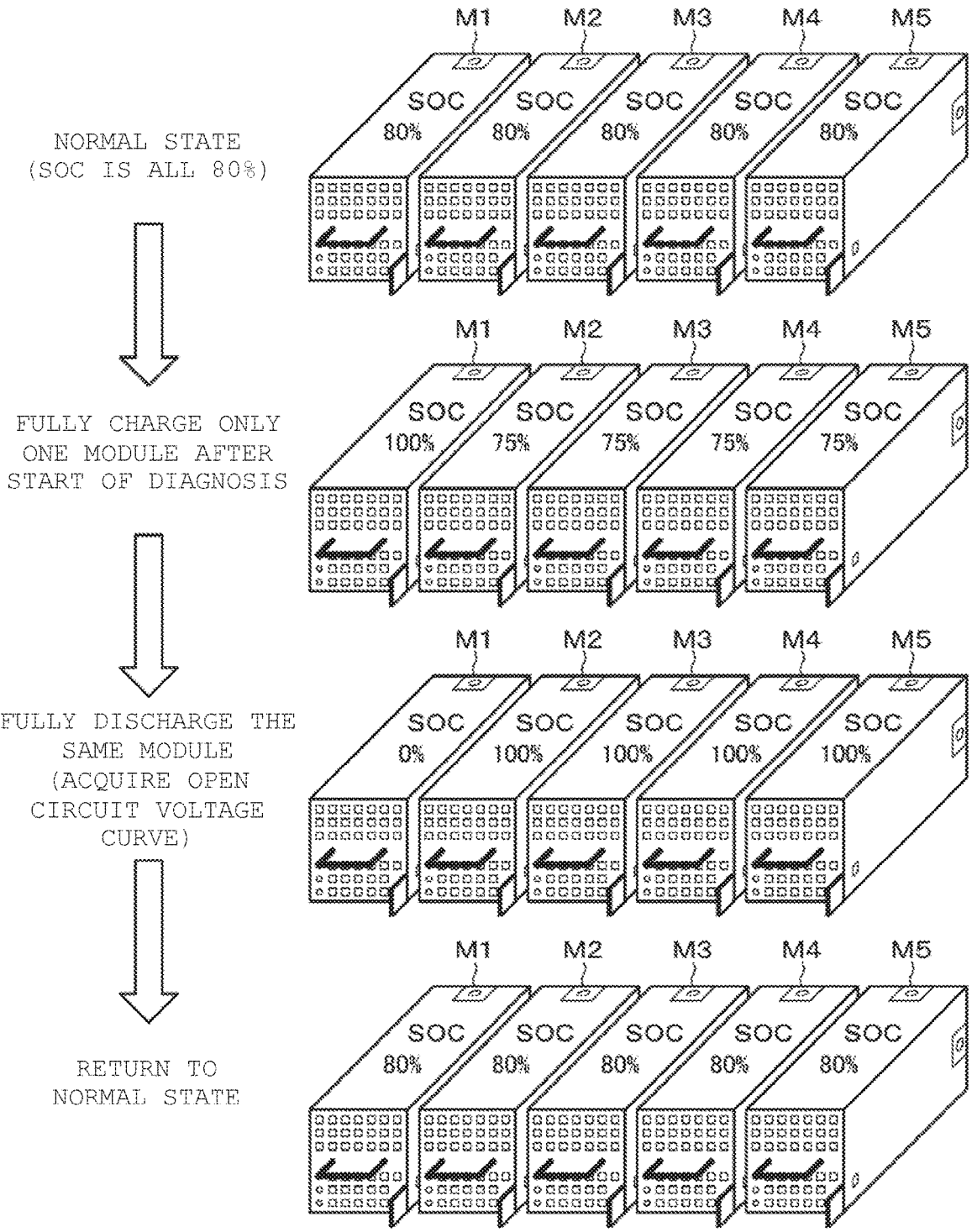
FIG. 10 is a diagram explaining a preferred example according to an embodiment of the present technology.

The description is made with reference to FIG. 10. In this drawing, five battery modules M1 to M5 constitute one set, and a state of charge (SOC, charge rate) is equal to 80% in a normal standby state. Next, in order to diagnose the degree of deterioration of the battery, one of the five battery modules (battery module M1) was selected, and the battery module M1 was charged to the charge cut-off voltage. As a result, the SOC of the battery module M1 became 100%. At this time, because the electric power for charging was supplemented by discharging the other four battery modules (battery modules M2 to M5), the SOC of the battery modules M2 to M5 became 75%.

Then, the battery module M1 was discharged to the discharge cut-off voltage while the open circuit voltage curve was acquired. As a result, the SOC of the battery module M1 becomes 0%. Because the discharged electric power was used to charge the battery modules M2 to M5, the SOC of the battery modules M2 to M5 became 100%. Then, the battery module M1 discharged until the SOC became 0% was charged, and the SOC was returned to 80%. Because the electric power at this time was supplemented by discharging the battery modules M2 to M5, the SOC of the battery modules M2 to M5 also became 80%. Thus, the original standby state was restored.

By exchanging the electric power between the battery modules as such, unnecessary external power can be eliminated in battery diagnosis such as obtaining the open circuit voltage curve and estimating the charge cut-off voltage and the discharge cut-off voltage. Although five battery modules have been used to constitute the set, the set may be constituted of 4 or less or 6 or more battery modules. Further, the SOC was considered to be 80% in the normal standby state of the battery module, however, the SOC may be another value.

Although the embodiment of the present technology has been specifically described above, the present technology is not limited to the above-described one embodiment, and various modifications based on the technical idea of the present technology are possible. Further, configurations, methods, steps, shapes, materials, numerical values, and the like described in the above-described embodiment are merely examples, and different configurations, methods, steps, shapes, materials, and numerical values may be used, as necessary. For example, the intermittent discharging has been configured by repeating discharging for 5 minutes and discharge pause for 2 minutes, however, time periods of the discharging and discharge pause may be combinations of other different numerical values.

Hereinafter, application examples of the battery control device are described. The application example of the battery control device is not limited to the application examples described below.

Figure 11:
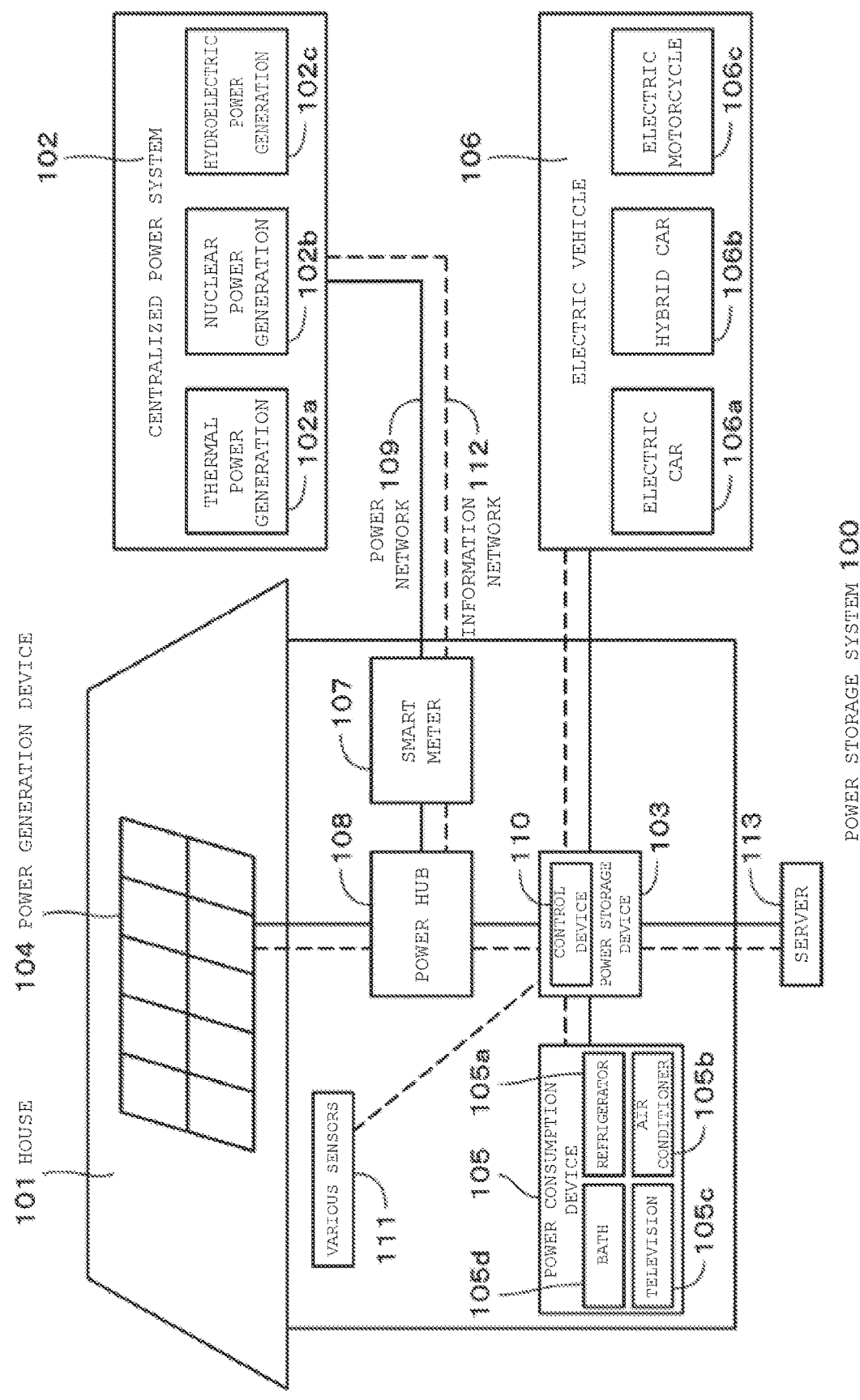
FIG. 11 is a schematic diagram showing an application example according to an embodiment of the present technology.

An example in which the present invention is applied to a power storage system for a house is described with reference to FIG. 11. For example, in a power storage system 100 for a house 101, electric power is supplied from a centralized power system 102 such as thermal power generation 102a, nuclear power generation 102b, and hydroelectric power generation 102c via a power network 109, an information network 112, a smart meter 107, a power hub 108, and the like, to a power storage device 103. At the same time, electric power is supplied to the power storage device 103 from an independent power source such as a power generation device 104. The electric power supplied to the power storage device 103 is stored. Then, electric power used in the house 101 is supplied using the power storage device 103. The similar power storage system can be used not only for the house 101 but also for a building.

The house 101 is provided with the power generation device 104, a power consumption device 105, the power storage device 103, a control device 110 that controls each device, the smart meter 107, and sensors 111 that acquires various kinds of information. The respective devices are connected by the power network 109 and the information network 112. A solar cell, a fuel cell, a wind turbine, or the like is used as the power generation device 104, and the generated power is supplied to the power consumption device 105 and/or the power storage device 103. The power consumption device 105 includes a refrigerator 105a, an air conditioner 105b, a television receiver 105c, a bath 105d, and the like. Further, the power consumption device 105 includes an electric vehicle 106. The electric vehicle 106 includes an electric car 106a, a hybrid car 106b, and an electric motorcycle 106c. The electric vehicle 106 may be an electric assist bicycle or the like.

The power storage device 103 is constituted of a secondary battery or a capacitor. For example, the power storage device is constituted of a lithium ion secondary battery. The lithium ion secondary battery may be a stationary type or may be used in the electric vehicle 106. The lithium ion secondary battery 1 of the present invention described above can be applied to this power storage device 103. The smart meter 107 has a function of detecting an amount of commercial power consumption and transmitting the detected amount of consumption to the power company. The power network 109 may be any one or a combination of a direct current (DC) power supply, an alternating current (AC) power supply, and a contactless power supply.

The various sensors 111 include, for example, a motion sensor, an illuminance sensor, an object detection sensor, a power consumption sensor, a vibration sensor, a contact sensor, a temperature sensor, an infrared sensor, and the like. The information acquired by the various sensors 111 is transmitted to the control device 110. Using the information from the sensors 111, the weather condition, the condition of a person, and the like can be grasped, so that the power consumption device 105 can be automatically controlled to minimize energy consumption. Further, the control device 110 can transmit information regarding the house 101 to the external power company or the like via the Internet.

The power hub 108 performs processing such as branching of power lines and direct current/alternating current (DC/AC) conversion. As a communication method of the information network 112 connected to the control device 110, there is a method of using a communication interface such as a Universal Asynchronous Receiver Transmitter (UART: transceiver circuit for asynchronous serial communication), or a method of using a sensor network based on a wireless communication standard such as Bluetooth®, ZigBee®, and Wi-Fi. The Bluetooth® method is applied to multimedia communication and can perform one-to-many connection communication. ZigBee® uses a physical layer of the Institute of Electrical and Electronics Engineers (IEEE) 802.15.4. IEEE 802.15.4 is the name of a short-range wireless network standard called a Personal Area Network (PAN) or a Wireless (W) PAN.

The control device 110 is connected to an external server 113. This server 113 may be managed by any of the house 101, the power company, and the service provider. The information transmitted and received by the server 113 is, for example, power consumption information, life pattern information, power charge, weather information, natural disaster information, and information on power transactions. These pieces of information may be transmitted and received from the power consumption device at home (for example, a television receiver), or may be transmitted and received from a device outside the home (for example, a mobile phone). These pieces of information may be displayed on a device having a display function, for example, a television receiver, a mobile phone, a personal digital assistant (PDA) or the like.

The control device 110 that controls each unit includes a central processing unit (CPU), a random access memory (RAM), a read only memory (ROM), and the like, and is accommodated in the power storage device 103 in this example. The control device 110 is connected to the power storage device 103, the power generation device 104, the power consumption device 105, the various sensors 111, and the server 113 by the information network 112, and has a function of adjusting, for example, the amount of commercial power consumption and the amount of power generation. In addition to the above, a function of conducting power trading in the power market may be provided.

As described above, not only the centralized power system 102 such as the thermal power generation 102a, the nuclear power generation 102b, and the hydroelectric power generation 102c, but also the power generated by the power generation device 104 (solar power and wind power) can be stored in the power storage device 103. Accordingly, even if the generated electric power of the power generation device 104 fluctuates, the control can be performed to keep the amount of electric power transmitted to the outside constant or to discharge the electric power, as necessary. For example, the electric power can be used in a manner in which the electric power obtained by solar power generation is stored in the power storage device 103, and meanwhile, the midnight power at night during which charge is low is stored in the power storage device 103, and the electric power stored in the power storage device 103 is discharged during a time period in daytime during which charge is high.

In this example, the example in which the control device 110 is accommodated in the power storage device 103 has been described, however, the control device 110 may be stored in the smart meter 107 or may be configured independently. Furthermore, the power storage system 100 may be used for a plurality of households in an apartment house or for a plurality of detached houses.

Figure 12:
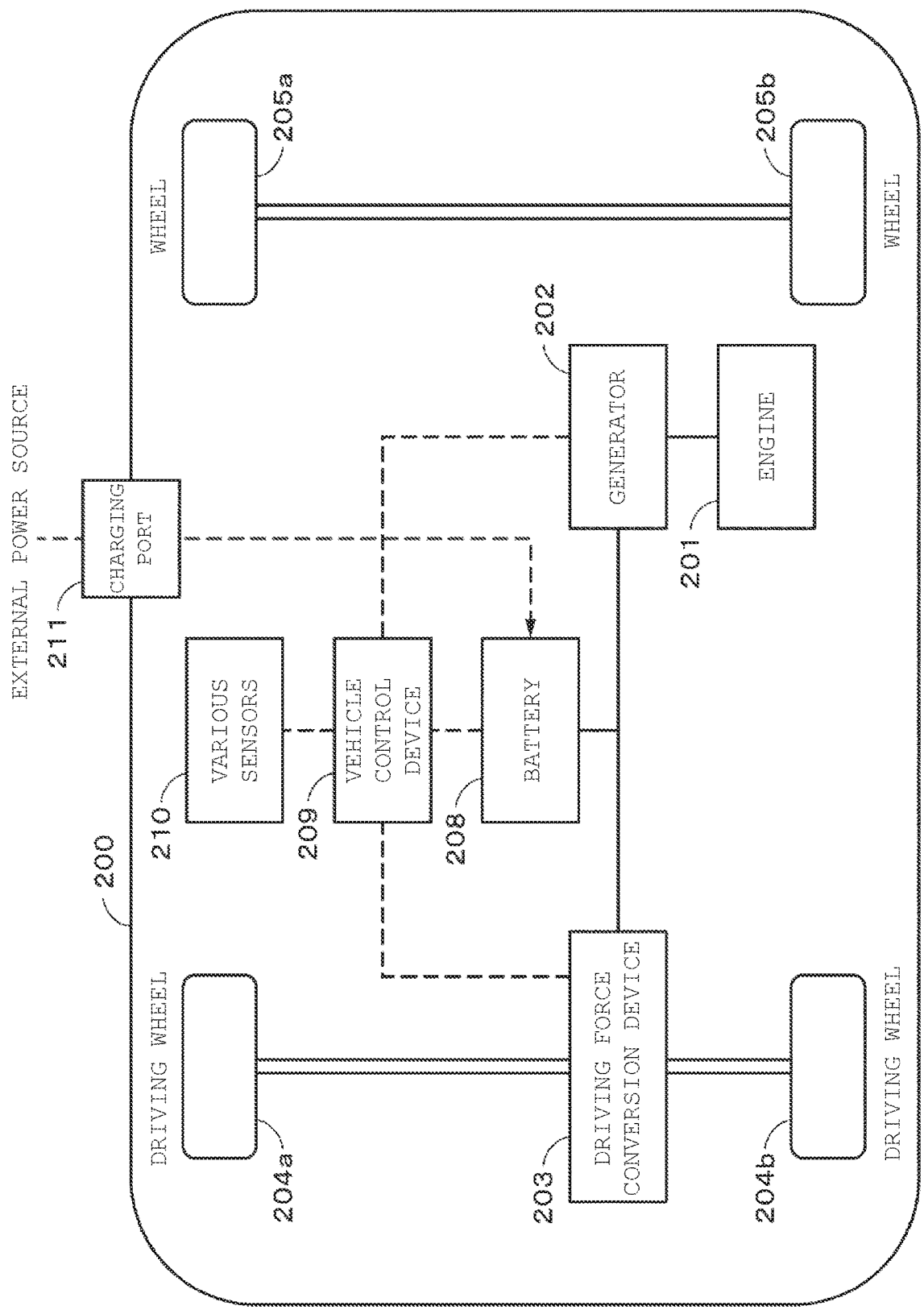
FIG. 12 is a schematic diagram showing an application example according to an embodiment of the present technology.

An example in which the present invention is applied to a power storage system for a vehicle is described with reference to FIG. 12. FIG. 12 schematically shows an example of a configuration of a hybrid vehicle that employs a series hybrid system to which the present invention is applied. The series hybrid system is a vehicle that travels on a power/driving force conversion device using electric power generated by a generator driven by an engine or electric power once stored in a battery.

The hybrid vehicle 200 is mounted with an engine 201, a generator 202, a power/driving force conversion device converter) 203, a driving wheel 204a, a driving wheel 204b, a wheel 205a, a wheel 205b, a battery 208, a vehicle control device 209, various sensors 210, and a charging port 211. The above-described lithium ion secondary battery 1 of the present invention is applied to the battery 208. One or more lithium ion secondary batteries 1 are applied.

The hybrid vehicle 200 travels using the power/driving force conversion device converter) 203 as a power source. An example of the power/driving force conversion device 203 is a motor. The power/driving force conversion device 203 operates by the electric power of the battery 208, and rotational force of the power/driving force conversion device 203 is transmitted to the driving wheels 204a, 204b. By using direct current-alternating current conversion (DC-AC conversion) or reverse conversion (AC-DC conversion) at necessary places, the power/driving force conversion device 203 can be applied to either an AC motor or a DC motor. The various sensors 210 control the engine speed via the vehicle control device 209, and control the opening of a not-shown throttle valve (throttle opening). The various sensors 210 include a speed sensor, an acceleration sensor, an engine speed sensor, and the like.

The rotational force of the engine 201 is transmitted to the generator 202, and the electric power generated by the generator 202 using the rotational force can be stored in the battery 208.

When the hybrid vehicle decelerates by a not-shown braking mechanism, resistance force at the time of deceleration is applied to the power/driving force conversion device 203 as rotational force, and the regenerative electric power generated by the power/driving force conversion device 203 by this rotational force is accumulated in the battery 208.

The battery 208 can be connected to an external power source of the hybrid vehicle to receive electric power from the external power source using the charging port 211 as an input port, and can store the received electric power.

Although not shown, an information processing device (controller) may be provided that performs information processing on vehicle control based on information regarding the secondary battery. As the information processing device as such, for example, there is an information processing device that displays a remaining battery level based on information regarding a remaining battery level. The information processing device (controller) may include a processor, a central processing unit (CPU), a random access memory (RAM), a read only memory (ROM), or the like.

In the above, the description has been made on the series hybrid vehicle as an example which travels by the motor, using electric power generated by the generator driven by an engine or electric power once stored in a battery. However, the present invention can be effectively applied for a parallel hybrid vehicle that uses output from both an engine and a motor as drive sources, and in which three modes including traveling only with the engine, traveling only with the motor, and traveling with the engine and the motor are switched as appropriate. Furthermore, the present invention can be effectively applied to a so-called electric vehicle that travels only by a drive motor and without using an engine.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A battery control device comprising:
a charge/discharge controller configured to charge or discharge a secondary battery during diagnosis;
an open circuit voltage curve acquisition device configured to acquire an open circuit voltage by charging or discharging the secondary battery; and
an arithmetic processor configured to estimate a potential of a positive electrode and a potential of a negative electrode from an open circuit voltage curve,
wherein
a charge cut-off voltage to stop charging and a discharge cut-off voltage to stop discharging are changed such that an estimated potential of the positive electrode does not exceed an upper limit and a lower limit of potential that are preset, as the number of cycles increases, the charge cut-off voltage is updated to be lower than the charge cut-off voltage at a first charging,
wherein the upper limit of the charge cut-off voltage is changed not to exceed the charge cut-off voltage $V_{fc}$ that is shown in formula (11),

[Mathematical formula 11]

$$\begin{cases} y_{p,fc}^{(n)} = 1 + \dfrac{S_p^{(n)}}{Q_p^{(n)}} \\ y_{p,fd}^{(n)} = 1 - \dfrac{Q^{(n)} - S_p^{(n)}}{Q_p^{(n)}} \\ y_{n,fc}^{(n)} = 1 + \dfrac{S_n^{(n)}}{Q_n^{(n)}} \\ y_{n,fd}^{(n)} = 1 - \dfrac{Q^{(n)} - S_n^{(n)}}{Q_n^{(n)}} \end{cases} \quad (6)$$

[Mathematical formula 16]

$$\begin{cases} V_{fc}^{(n)} = \varphi_p\!\left(1 - \left(y_{p,fc}^{(n)} - y_{p,fd}^{(n)}\right)s_{fc}^{(n)} - y_{p,fd}^{(n)}\right) \\ V_{fc}^{(n)} = \varphi_p\!\left(1 - \left(y_{p,fc}^{(n)} - y_{p,fd}^{(n)}\right)s_{fd}^{(n)} - y_{p,fd}^{(n)}\right) \end{cases} \quad (11)$$

$$-\varphi_n\!\left(1 - \left(y_{n,fc}^{(n)} - y_{n,fd}^{(n)}\right)s_{fc}^{(n)} - y_{n,fd}^{(n)}\right)$$
$$-\varphi_n\!\left(1 - \left(y_{n,fc}^{(n)} - y_{n,fd}^{(n)}\right)s_{fd}^{(n)} - y_{n,fd}^{(n)}\right)$$

[Mathematical formula 17]

$$\begin{cases} s_{fc}^{(n)} \equiv \min\!\left\{ \dfrac{y_{p,fc}^{(1)} - y_{p,fd}^{(n)}}{y_{p,fc}^{(n)} - y_{p,fd}^{(n)}}, \dfrac{y_{n,fc}^{(1)} - y_{n,fd}^{(n)}}{y_{n,fc}^{(n)} - y_{n,fd}^{(n)}} \right\} \\ s_{fd}^{(n)} \equiv \min\!\left\{ \dfrac{y_{p,fd}^{(1)} - y_{p,fd}^{(n)}}{y_{p,fc}^{(n)} - y_{p,fd}^{(n)}}, \dfrac{y_{n,fd}^{(1)} - y_{n,fd}^{(n)}}{y_{n,fc}^{(n)} - y_{n,fd}^{(n)}} \right\} \end{cases} \quad (12)$$

wherein Qp is a positive net capacity or a positive electrode expansion rate, Qn is a negative net capacity or a negative electrode expansion rate, Sp is a positive slippage or a positive electrode parallel displacement, and Sn is a negative slippage or a negative electrode parallel displacement,
wherein a degree of charge of the positive electrode in the fully charged state is denoted as $y_{p,fc}$, a degree of charge of the positive electrode in the fully discharged state as $y_{p,fd}$, a degree of charge of the negative electrode in the fully charged state as $y_{n,fc}$, a degree of charge of the negative electrode in the fully discharged state as $y_{n,fd}$, values are expressed as in formula (6) using a positive net capacity, a negative net capacity, the positive slippage, the negative slippage, and a discharge capacity,
wherein a positive electrode potential function is denoted as $\varphi_p$ (x), a negative electrode potential function is denoted as $\varphi_n$ (x), x is a degree of charge, which takes a range of 0 to 1, the closer x is to 0, the more charged the battery is, and the closer x is to 1, the more discharged the battery is, and superscripts (n) on an upper right of y and Q represent the number of charge/discharge cycles, and
wherein the discharge cut-off voltage is set to $V_{fd}$, and superscript (n) on an upper right of V represents the number of charge/discharge cycles, and $s_{fc}$ and $s_{fd}$ in formula (11) are defined as in formula (12).

2. The battery control device according to claim 1, wherein the open circuit voltage curve acquisition device estimates the open circuit voltage from a transient response when the secondary battery is intermittently charged or discharged.

3. An uninterruptible power supply, comprising:
a battery control device according to claim 1,
a plurality of battery modules each having a plurality of secondary batteries are provided;
one of the plurality of battery modules is discharged to charge others of the plurality of battery modules with a discharge current; and
the one of the plurality of battery modules is charged by the others of the plurality of battery modules.

4. A power system comprising a secondary battery controlled by the battery control device according to claim 1,
wherein the secondary battery is charged by a power generation device whose power is configured be generated from renewable energy.

5. A power system comprising a secondary battery controlled by the battery control device according to claim 1, wherein the power system is configured to supply power to an electronic device connected to the secondary battery.

6. An electric vehicle comprising a secondary battery controlled by the battery control device according to claim 1,
wherein the electric vehicle further includes:
a converter configured to receive supply of power from the secondary battery to convert the power into driving force of the electric vehicle; and a controller configured to perform information processing related to vehicle control based on information on the secondary battery.

7. A power system comprising a secondary battery controlled by the battery control device according to claim 1, wherein the power system is configured to receive power from the secondary battery or supply power to the secondary battery from a power generation device or a power network.

8. The battery control device according to claim 1, wherein

[Mathematical formula 12]

$$y_{p,fc}^{(n)} > y_{p,fc}^{(1)} \quad (7)$$

[Mathematical formula 13]

$$y_{p,fd}^{(n)} < y_{p,fd}^{(1)} \quad (8)$$

[Mathematical formula 14]

$$y_{n,fc}^{(n)} < y_{n,fc}^{(1)} \quad (9)$$

[Mathematical formula 15]

$$y_{n,fd}^{(n)} > y_{n,fd}^{(1)} \quad (10)$$

formulae (7) to (10) are made not to be satisfied in the charging and discharging in the nth cycle.

9. A battery control device comprising:
a charge/discharge controller configured to charge or discharge a secondary battery during diagnosis;
an open circuit voltage curve acquisition device configured to acquire an open circuit voltage by charging or discharging the secondary battery; and
an arithmetic processor configured to estimate a potential of a positive electrode and a potential of a negative electrode from an open circuit voltage curve,
wherein
a charge cut-off voltage to stop charging and a discharge cut-off voltage to stop discharging are changed such that an estimated potential of the negative electrode does not exceed an upper limit and a lower limit of potential that are preset,
as the number of cycles increases, the discharge cut-off voltage is updated to be higher than the discharge cut-off voltage at a first discharging,
wherein the lower limit of the discharge cut-off voltage is changed not to exceed the discharge cut-off voltage $V_{fd}$ that is shown in formula (11),

[Mathematical formula 11]

$$\begin{cases} y_{p,fc}^{(n)} = 1 + \dfrac{S_p^{(n)}}{Q_p^{(n)}} \\ y_{p,fd}^{(n)} = 1 - \dfrac{Q^{(n)} - S_p^{(n)}}{Q_p^{(n)}} \\ y_{n,fc}^{(n)} = 1 + \dfrac{S_n^{(n)}}{Q_n^{(n)}} \\ y_{n,fd}^{(n)} = 1 - \dfrac{Q^{(n)} - S_n^{(n)}}{Q_n^{(n)}} \end{cases} \quad (6)$$

[Mathematical formula 16]

$$\begin{cases} V_{fc}^{(n)} = \varphi_p\left(1 - (y_{p,fc}^{(n)} - y_{p,fd}^{(n)})s_{fc}^{(n)} - y_{p,fd}^{(n)}\right) \\ V_{fc}^{(n)} = \varphi_p\left(1 - (y_{p,fc}^{(n)} - y_{p,fd}^{(n)})s_{fd}^{(n)} - y_{p,fd}^{(n)}\right) \end{cases} \quad (11)$$

$$-\varphi_n\left(1 - (y_{n,fc}^{(n)} - y_{n,fd}^{(n)})s_{fc}^{(n)} - y_{n,fd}^{(n)}\right)$$
$$-\varphi_n\left(1 - (y_{n,fc}^{(n)} - y_{n,fd}^{(n)})s_{fd}^{(n)} - y_{n,fd}^{(n)}\right)$$

[Mathematical formula 17]

$$\begin{cases} s_{fc}^{(n)} \equiv \min\left\{\dfrac{y_{p,fc}^{(1)} - y_{p,fd}^{(n)}}{y_{p,fc}^{(n)} - y_{p,fd}^{(n)}}, \dfrac{y_{n,fc}^{(1)} - y_{n,fd}^{(n)}}{y_{n,fc}^{(n)} - y_{n,fd}^{(n)}}\right\} \\ s_{fd}^{(n)} \equiv \min\left\{\dfrac{y_{p,fd}^{(1)} - y_{p,fd}^{(n)}}{y_{p,fc}^{(n)} - y_{p,fd}^{(n)}}, \dfrac{y_{n,fd}^{(1)} - y_{n,fd}^{(n)}}{y_{n,fc}^{(n)} - y_{n,fd}^{(n)}}\right\} \end{cases} \quad (12)$$

wherein Qp is a positive net capacity or a positive electrode expansion rate, Qn is a negative net capacity or a negative electrode expansion rate, Sp is a positive slippage or a positive electrode parallel displacement, and Sn is a negative slippage or a negative electrode parallel displacement,
wherein a degree of charge of the positive electrode in the fully charged state is denoted as $y_{p,fc}$, a degree of charge of the positive electrode in the fully discharged state as $y_{p,fd}$, a degree of charge of the negative electrode in the fully charged state as $y_{n,fc}$, a degree of charge of the negative electrode in the fully discharged state as $y_{n,fd}$, values are expressed as in formula (6) using a positive net capacity, a negative net capacity, the positive slippage, the negative slippage, and a discharge capacity,
wherein a positive electrode potential function is denoted as $\varphi_p$ (x), a negative electrode potential function is denoted as $\varphi_n$ (x), x is a degree of charge, which takes a range of 0 to 1, the closer x is to 0, the more charged the battery is, and the closer x is to 1, the more discharged the battery is, and superscripts (n) on an upper right of y and Q represent the number of charge/discharge cycles, and
wherein the charge cut-off voltage is set to $V_{fc}$, and superscript (n) on an upper right of V represents the number of charge/discharge cycles, and $s_{fc}$ and $s_{fd}$ in formula (11) are defined as in formula (12).

10. The battery control device according to claim 9, wherein the open circuit voltage curve acquisition device estimates the open circuit voltage from a transient response when the secondary battery is intermittently charged or discharged.

11. An uninterruptible power supply, comprising:
a battery control device according to claim 9,
a plurality of battery modules each having a plurality of secondary batteries are provided;
one of the plurality of battery modules is discharged to charge others of the plurality of battery modules with a discharge current; and
the one of the plurality of battery modules is charged by the others of the plurality of battery modules.

12. The battery control device according to claim 9, wherein

[Mathematical formula 12]

$$y_{p,fc}^{(n)} > y_{p,fc}^{(1)} \quad (7)$$

[Mathematical formula 13]

$$y_{p,fd}^{(n)} < y_{p,fd}^{(1)} \quad (8)$$

[Mathematical formula 14]

$$y_{n,fc}^{(n)} < y_{n,fc}^{(1)} \quad (9)$$

[Mathematical formula 15]

$$y_{n,fd}^{(n)} > y_{n,fd}^{(1)} \quad (10)$$

formulae (7) to (10) are made not to be satisfied in the charging and discharging in the nth cycle.

13. A battery control method comprising:
acquiring an open circuit voltage curve by charging or discharging a secondary battery during diagnosis;
estimating a potential of a positive electrode and a potential of a negative electrode from the open circuit voltage curve;
changing a charge cut-off voltage to stop charging and a discharge cut-off voltage to stop discharging such that an estimated potential of the positive electrode does not exceed an upper limit and a lower limit of potential that are preset,
updating the charge cut-off voltage to be lower than the charge cut-off voltage at a first charging, as the number of cycles increases,
wherein the upper limit of the charge cut-off voltage is changed not to exceed the charge cut-off voltage $V_{fc}$ that is shown in formula (11),

[Mathematical formula 11]

$$\begin{cases} y_{p,fc}^{(n)} = 1 + \dfrac{S_p^{(n)}}{Q_p^{(n)}} \\ y_{p,fd}^{(n)} = 1 - \dfrac{Q^{(n)} - S_p^{(n)}}{Q_p^{(n)}} \\ y_{n,fc}^{(n)} = 1 + \dfrac{S_n^{(n)}}{Q_n^{(n)}} \\ y_{n,fd}^{(n)} = 1 - \dfrac{Q^{(n)} - S_n^{(n)}}{Q_n^{(n)}} \end{cases} \quad (6)$$

[Mathematical formula 16]

$$\begin{cases} V_{fc}^{(n)} = \varphi_p\left(1 - \left(y_{p,fc}^{(n)} - y_{p,fd}^{(n)}\right)s_{fc}^{(n)} - y_{p,fd}^{(n)}\right) \\ V_{fc}^{(n)} = \varphi_p\left(1 - \left(y_{p,fc}^{(n)} - y_{p,fd}^{(n)}\right)s_{fd}^{(n)} - y_{p,fd}^{(n)}\right) \\ \quad -\varphi_n\left(1 - \left(y_{n,fc}^{(n)} - y_{n,fd}^{(n)}\right)s_{fc}^{(n)} - y_{n,fd}^{(n)}\right) \\ \quad -\varphi_n\left(1 - \left(y_{n,fc}^{(n)} - y_{n,fd}^{(n)}\right)s_{fd}^{(n)} - y_{n,fd}^{(n)}\right) \end{cases} \quad (11)$$

[Mathematical formula 17]

$$\begin{cases} s_{fc}^{(n)} \equiv \min\left\{\dfrac{y_{p,fc}^{(1)} - y_{p,fd}^{(n)}}{y_{p,fc}^{(n)} - y_{p,fd}^{(n)}}, \dfrac{y_{n,fc}^{(1)} - y_{n,fd}^{(n)}}{y_{n,fc}^{(n)} - y_{n,fd}^{(n)}}\right\} \\ s_{fd}^{(n)} \equiv \min\left\{\dfrac{y_{p,fd}^{(1)} - y_{p,fd}^{(n)}}{y_{p,fc}^{(n)} - y_{p,fd}^{(n)}}, \dfrac{y_{n,fd}^{(1)} - y_{n,fd}^{(n)}}{y_{n,fc}^{(n)} - y_{n,fd}^{(n)}}\right\} \end{cases} \quad (12)$$

wherein Qp is a positive net capacity or a positive electrode expansion rate, Qn is a negative net capacity or a negative electrode expansion rate, Sp is a positive slippage or a positive electrode parallel displacement, and Sn is a negative slippage or a negative electrode parallel displacement,
wherein a degree of charge of the positive electrode in the fully charged state is denoted as $y_{p,fc}$, a degree of charge of the positive electrode in the fully discharged state as $y_{p,fd}$, a degree of charge of the negative electrode in the fully charged state as $y_{n,fc}$, a degree of charge of the negative electrode in the fully discharged state as $y_{n,fd}$, values are expressed as in formula (6) using a positive net capacity, a negative net capacity, the positive slippage, the negative slippage, and a discharge capacity,
wherein a positive electrode potential function is denoted as $\varphi_p(x)$, a negative electrode potential function is denoted as $\varphi_n(x)$, x is a degree of charge, which takes a range of 0 to 1, the closer x is to 0, the more charged the battery is, and the closer x is to 1, the more discharged the battery is, and superscripts (n) on an upper right of y and Q represent the number of charge/discharge cycles, and
wherein the discharge cut-off voltage is set to $V_{fd}$, and superscript (n) on an upper right of V represents the number of charge/discharge cycles, and $s_{fc}$ and $s_{fd}$ in formula (11) are defined as in formula (12).

14. The battery control method according to claim 13, wherein the open circuit voltage curve is estimated from a transient response when the secondary battery is intermittently charged or discharged.

15. The battery control method according to claim 13, wherein

[Mathematical formula 12]

$$y_{p,fc}^{(n)} > y_{p,fc}^{(1)} \quad (7)$$

[Mathematical formula 13]

$$y_{p,fd}^{(n)} < y_{p,fd}^{(1)} \quad (8)$$

[Mathematical formula 14]

$$y_{n,fc}^{(n)} < y_{n,fc}^{(1)} \quad (9)$$

[Mathematical formula 15]

$$y_{n,fd}^{(n)} > y_{n,fd}^{(1)} \quad (10)$$

formulae (7) to (10) are made not to be satisfied in the charging and discharging in the nth cycle.

16. A battery control method comprising:

acquiring an open circuit voltage curve by charging or discharging a secondary battery during diagnosis;

estimating a potential of a positive electrode and a potential of a negative electrode from the open circuit voltage curve;

changing a charge cut-off voltage to stop charging and a discharge cut-off voltage to stop discharging such that an estimated potential of the negative electrode does not exceed an upper limit and a lower limit of potential that are preset; and updating the discharge cut-off voltage to be higher than the first discharge cut-off voltage at a first discharging, as the number of cycles increases, wherein the lower limit of the discharge cut-off voltage is changed not to exceed the discharge cut-off voltage $V_{fd}$ that is shown in formula (11),

[Mathematical formula 11]

$$\begin{cases} y_{p,fc}^{(n)} = 1 + \dfrac{S_p^{(n)}}{Q_p^{(n)}} \\ y_{p,fd}^{(n)} = 1 - \dfrac{Q^{(n)} - S_p^{(n)}}{Q_p^{(n)}} \\ y_{n,fc}^{(n)} = 1 + \dfrac{S_n^{(n)}}{Q_n^{(n)}} \\ y_{n,fd}^{(n)} = 1 - \dfrac{Q^{(n)} - S_n^{(n)}}{Q_n^{(n)}} \end{cases} \quad (6)$$

[Mathematical formula 16]

$$\begin{cases} V_{fc}^{(n)} = \varphi_p\left(1 - \left(y_{p,fc}^{(n)} - y_{p,fd}^{(n)}\right)s_{fc}^{(n)} - y_{p,fd}^{(n)}\right) \\ V_{fc}^{(n)} = \varphi_p\left(1 - \left(y_{p,fc}^{(n)} - y_{p,fd}^{(n)}\right)s_{fd}^{(n)} - y_{p,fd}^{(n)}\right) \\ \quad - \varphi_n\left(1 - \left(y_{n,fc}^{(n)} - y_{n,fd}^{(n)}\right)s_{fc}^{(n)} - y_{n,fd}^{(n)}\right) \\ \quad - \varphi_n\left(1 - \left(y_{n,fc}^{(n)} - y_{n,fd}^{(n)}\right)s_{fd}^{(n)} - y_{n,fd}^{(n)}\right) \end{cases} \quad (11)$$

[Mathematical formula 17]

$$\begin{cases} s_{fc}^{(n)} \equiv \min\left\{\dfrac{y_{p,fc}^{(1)} - y_{p,fd}^{(n)}}{y_{p,fc}^{(n)} - y_{p,fd}^{(n)}}, \dfrac{y_{n,fc}^{(1)} - y_{n,fd}^{(n)}}{y_{n,fc}^{(n)} - y_{n,fd}^{(n)}}\right\} \\ s_{fd}^{(n)} \equiv \min\left\{\dfrac{y_{p,fd}^{(1)} - y_{p,fd}^{(n)}}{y_{p,fc}^{(n)} - y_{p,fd}^{(n)}}, \dfrac{y_{n,fd}^{(1)} - y_{n,fd}^{(n)}}{y_{n,fc}^{(n)} - y_{n,fd}^{(n)}}\right\} \end{cases} \quad (12)$$

wherein Qp is a positive net capacity or a positive electrode expansion rate, Qn is a negative net capacity or a negative electrode expansion rate, Sp is a positive slippage or a positive electrode parallel displacement, and Sn is a negative slippage or a negative electrode parallel displacement, wherein a degree of charge of the positive electrode in the fully charged state is denoted as $y_{p,fc}$, a degree of charge of the positive electrode in the fully discharged state as $y_{p,fd}$, a degree of charge of the negative electrode in the fully charged state as $y_{n,fc}$, a degree of charge of the negative electrode in the fully discharged state as $y_{n,fd}$, values are expressed as in formula (6) using a positive net capacity, a negative net capacity, the positive slippage, the negative slippage, and a discharge capacity, wherein a positive electrode potential function is denoted as $\varphi_p(x)$, a negative electrode potential function is denoted as $\varphi_n(x)$, x is a degree of charge, which takes a range of 0 to 1, the closer x is to 0, the more charged the battery is, and the closer x is to 1, the more discharged the battery is, and superscripts (n) on an upper right of y and Q represent the number of charge/discharge cycles, and wherein the charge cut-off voltage is set to $V_{fc}$, and superscript (n) on an upper right of V represents the number of charge/discharge cycles, and $s_{fc}$ and $s_{fd}$ in formula (11) are defined as in formula (12).

17. The battery control method according to claim 16, wherein the open circuit voltage curve is estimated from a transient response when the secondary battery is intermittently charged or discharged.

18. The battery control method according to claim 16, wherein

[Mathematical formula 12]

$$y_{p,fc}^{(n)} > y_{p,fc}^{(1)} \quad (7)$$

[Mathematical formula 13]

$$y_{p,fd}^{(n)} < y_{p,fd}^{(1)} \quad (8)$$

[Mathematical formula 14]

$$y_{n,fc}^{(n)} < y_{n,fc}^{(1)} \quad (9)$$

[Mathematical formula 15]

$$y_{n,fd}^{(n)} > y_{n,fd}^{(1)} \quad (10)$$

formulae (7) to (10) are made not to be satisfied in the charging and discharging in the nth cycle.

\* \* \* \* \*